(12) United States Patent
Tanahashi

(10) Patent No.: US 6,650,160 B2
(45) Date of Patent: Nov. 18, 2003

(54) TWO STEP VARIABLE LENGTH DELAY CIRCUIT

(75) Inventor: Toshio Tanahashi, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 10/059,372

(22) Filed: Jan. 31, 2002

(65) Prior Publication Data

US 2002/0101271 A1 Aug. 1, 2002

(30) Foreign Application Priority Data

Feb. 1, 2001 (JP) ........................... 2001-026166

(51) Int. Cl.[7] .................................... H03H 11/26
(52) U.S. Cl. ....................... 327/277; 327/284; 327/298
(58) Field of Search ......................... 327/261, 263–266, 327/269–271, 272, 274–278, 280, 281, 284, 287, 288, 291, 295, 298, 407

(56) References Cited

U.S. PATENT DOCUMENTS

| | | | | |
|---|---|---|---|---|
| 5,901,190 A | * | 5/1999 | Lee | 375/373 |
| 6,100,735 A | * | 8/2000 | Lu | 327/158 |
| 6,104,228 A | * | 8/2000 | Lakshmikumar | 327/407 |
| 6,441,657 B1 | * | 8/2002 | Saeki | 327/119 |

FOREIGN PATENT DOCUMENTS

| | | |
|---|---|---|
| JP | 6-204972 | 7/1994 |
| JP | 11-261408 | 9/1999 |
| JP | 2000-163961 | 6/2000 |
| JP | 2000-195166 | 7/2000 |
| JP | 2000-252802 | 9/2000 |
| JP | 2000-298532 | 10/2000 |

OTHER PUBLICATIONS

S. Sidiropoulos et al., "A Semidigital Dual Delay–Looked Loop", IEEE Journal of Solid–State Circuits, vol. 32, pp. 1683–1692, Nov. 1997.

Bruno W. Garlepp et al. "A Portable Digital DLL Architecture for CMOS Interface Circuits", 1998 IEEE Symposium on VLSI Circuits Digest of Technical Papers, pp. 214–215.

* cited by examiner

*Primary Examiner*—Minh Nguyen
(74) *Attorney, Agent, or Firm*—McGinn & Gibb, PLLC

(57) ABSTRACT

A method (and structure) of generating a two step variable length delay, including passing an input clock signal through a plurality of serially-interconnected delay elements, each delay element having a delay time interval dtc, thereby generating a corresponding plurality delayed signals. A set of m (where m is an integer greater than 2) of the plurality of delayed signals is switably selected. The selected m delayed signals form a first to an mth coarse adjustment delay signals. An nth coarse adjustment delay signal leads an (n+1)th coarse adjustment delay signal in phase by a time interval dtc (n is an integer being 1 or more and (m−1) or less). From the first to mth coarse adjustment delay signals, 2m fine adjustment delay signals are generated, where a jth fine adjustment delay signal leads a (j+1)th fine adjustment delay signal in a phase by a time interval dtc', where time interval dtc' is finer than the time interval dtc. The generation is achieved by amplifying the first to mth coarse adjustment delay signals, by mixing, for each n, waveforms of the nth and the (n+1)th coarse adjustment delay signals, and mixing waveforms of the mth and the first coarse adjustment delay signals. One of the 2m fine adjustment delay signals is outputted to be a selected variable length delay output signal.

32 Claims, 10 Drawing Sheets

FIG. 5
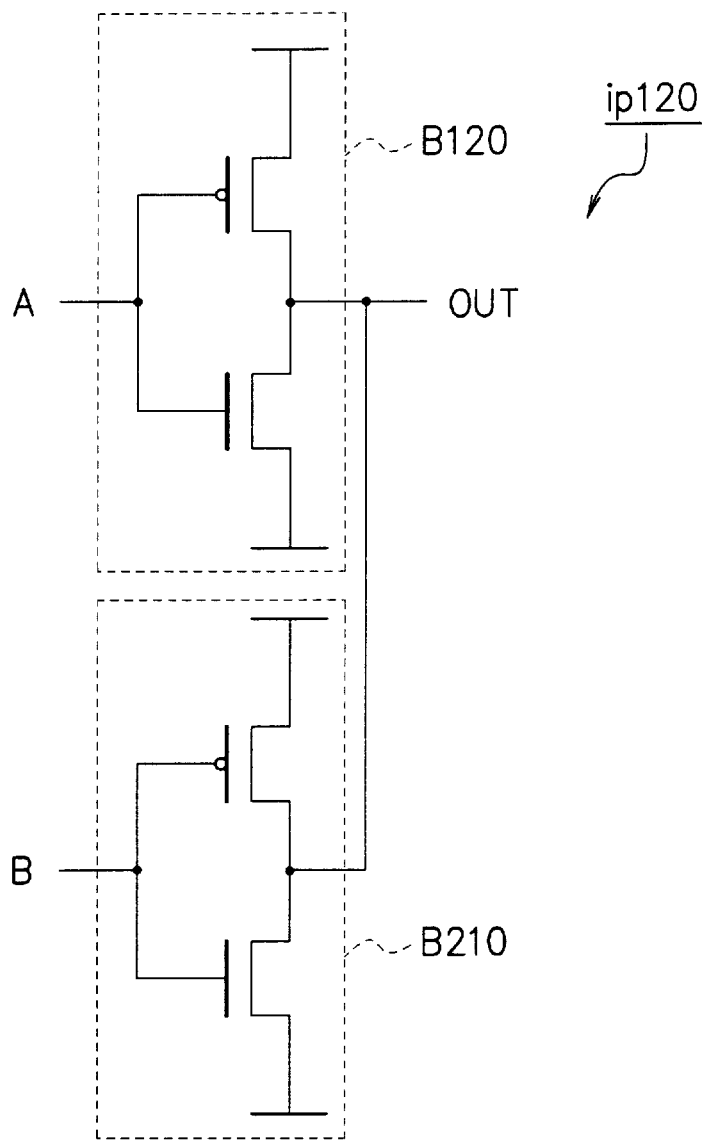
(a)
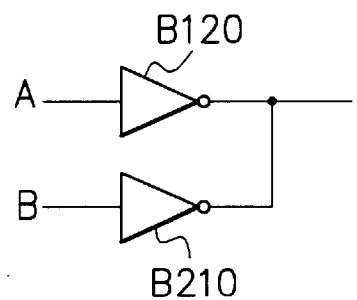
(b)

FIG. 6
(a)
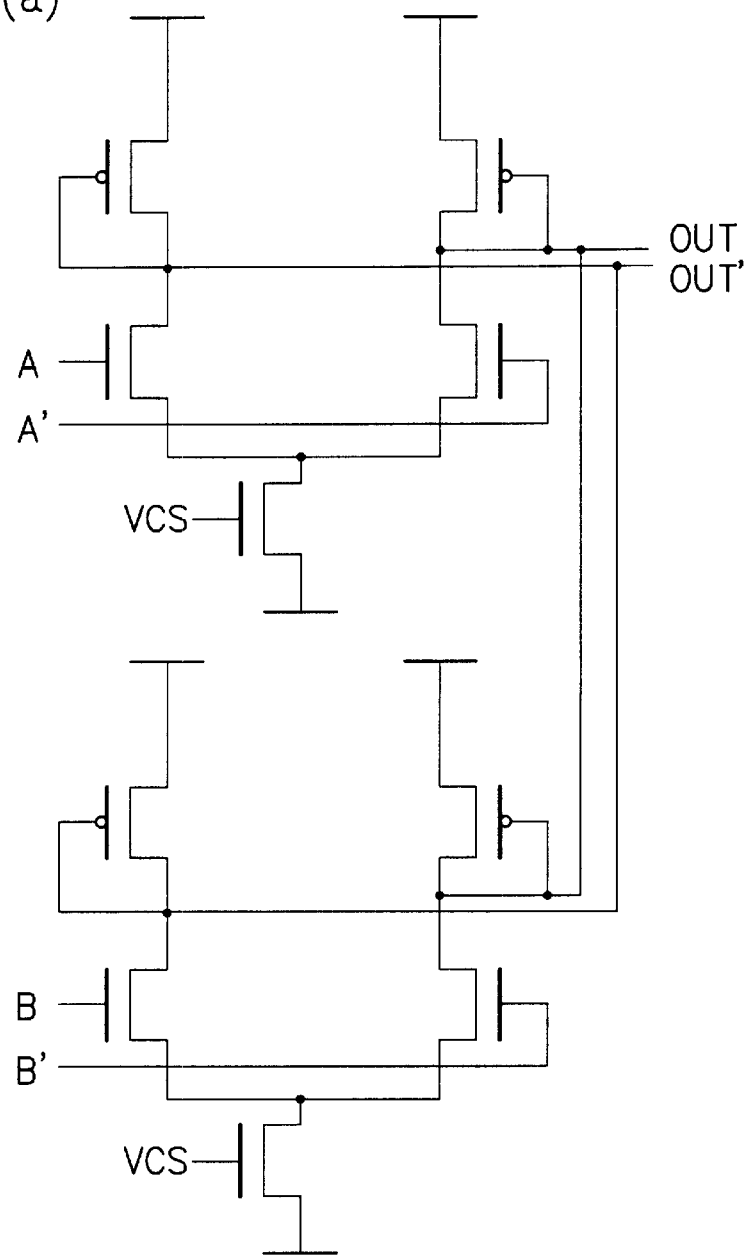
(b)
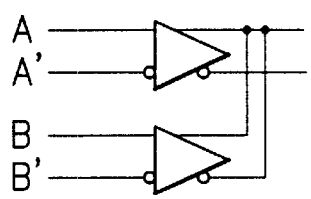

FIG. 8
(a)
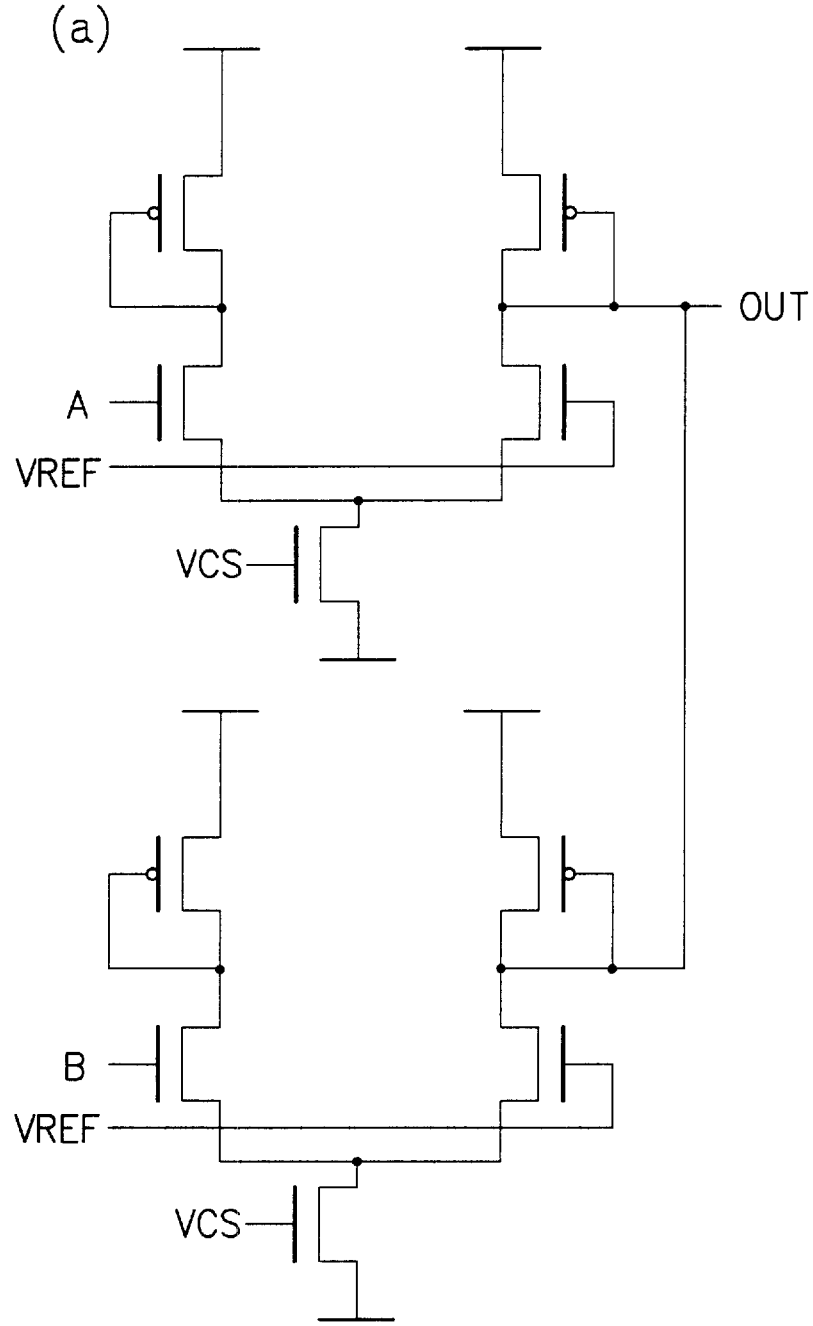
OUT
A
VREF
VCS
B
VREF
VCS
(b)
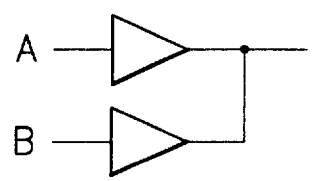
A
B

TWO STEP VARIABLE LENGTH DELAY CIRCUIT

BACKGROUND OF THE INVENTION

The present invention relates to a two step variable length delay circuit, in particular, which is used for a delay-locked loop (DLL) in a clock generating circuit of an information processing apparatus and in a timing generating circuit of a communication processing apparatus.

DESCRIPTION OF THE RELATED ART

As a first conventional example, a technical report, "A Semidigital Dual Delay-Locked Loop" written by S. Sidiropoulos et al., has been reported in IEEE Journal of Solid-State Circuits, vol. 32, pp. 1683–1692, November 1997. And as a second conventional example, Japanese Patent Application Laid-Open No. HEI 11-261408 discloses "Phase Interpolator, Timing Signal Generating Circuit, and Semiconductor Integrated Circuit and Semiconductor Integrated Circuit System Applied This Timing Signal Generating Circuit." In these conventional examples, a variable length delay circuit is realized by an analog mixer circuit that mixes currents of two signals whose phases are different each other, however, it is difficult to realize its required specifications due to the dispersion of the circuits. Therefore, a variable length delay circuit, in which its easy designing and operation stability are secured by using digital circuits, has been required.

As a third conventional example, a technical report, "A Portable Digital DLL Architecture for CMOS Interface Circuits" written by Bruno W. Garlepp et al., has been reported in 1998 Symposium on VLSI Circuits Digest of Technical Papers, pp. 214–215. In this conventional example, in order to meet the request mentioned above, not only a controlling circuit but also delay elements are digitized.

FIG. 1 is a circuit diagram showing a two step variable length delay circuit including interpolators at the third conventional example. Referring to FIG. 1, the two step variable length delay circuit at the third conventional example is explained.

The two step variable length delay circuit at the third conventional example provides inputs In1 and In2, outputs a to c and e to i, buffers (inverters) B100 to B103, B121 to B123, B123$i$, B200 to B203, and B213$i$, and interpolators ip120, ip121, and ip122.

The interpolator ip120 provides buffers B120 and B210, the interpolator ip121 provides buffers B120$i$ and B121$i$, and the interpolator ip122 provides buffers B210$i$ and B211$i$.

In this, an output from the inverter B100, to which the input In1 is inputted, is amplified by the buffer B101 and the output a is outputted, and an output from the inverter B200, to which the input In2 is inputted, is amplified by the buffer B201 and the output c is outputted. The interpolator ip120 mixes currents of the outputs from the buffers B120 and B210 by connecting them, and the output from the interpolator ip120 is amplified at the buffer B121 and the output b is outputted. And the phase of the output b becomes the middle phase of the outputs a and c in this digital circuit of the two step variable length delay circuit at the third conventional example.

Further, the output a from the buffer B101 is inputted to the inverter B102, and the buffer B103 amplifies the output from the inverter B102. The output b from the buffer B121 is inputted to the inverter B122, and the buffer B123 amplifies the output from the inverter B122. The interpolator ip121 outputs a signal by connecting the output from the B120$i$, to which the output a is inputted, and the output from the B121$i$, to which the output b is inputted, and the buffer B123$i$ amplifies the output from the interpolator ip121. The interpolator ip122 outputs a signal by connecting the output from the B210$i$, to which the output b is inputted, and the output from the B211$i$, to which the output c is inputted, and the buffer B213$i$ amplifies the output from the interpolator ip122. The output c from the buffer B201 is inputted to the inverter B202, and the buffer B203 amplifies the output from the inverter B202. With this structure, fine time intervals are obtained.

At the third conventional example, as mentioned above, three interpolators are used and the eight outputs are obtained by dividing the input phases into eight. In this, actually, nine outputs are obtained, but the ninth output is not outputted, because the ninth output is equal to the first output at the next output combination.

As a fourth conventional example, Japanese Patent Application Laid-Open No. 2000-163961 discloses "Synchronous Type Semiconductor IC." In this application, an internal clock signal being synchronized with an external clock signal is generated by applying a fine adjustment to phases, after a coarse adjustment was applied to the phases. With this, generating a glitch caused by the change of the input signal is prevented.

As a fifth conventional example, Japanese Patent Application Laid-Open No. 2000-195166 discloses "Delay Time Control Circuit." In this application, pulse signals delayed by a designated delay time are counted by using a delay circuit, and pulse signals having a suitable delay time are generated, even when the delay time of a unit circuit is changed.

As a sixth conventional example, Japanese Patent Application Laid-Open No. 2000-252802 discloses "Clock Cycle Detecting Circuit." In this application, an operating range of the phase adjustment is widened by applying the coarse adjustment beforehand.

As a seventh conventional example, Japanese Patent Application Laid-Open No. 2000-298532 discloses "Timing Control Circuit." In this application, the timing control circuit provides a coarse timing control circuit that coarsely adjusts the phase difference between an input clock signal and an output clock signal, and a fine timing control circuit that finely adjusts the phase difference in case that the delay time is change caused by like a temperature rise.

And as an eighth conventional example, Japanese Patent Application Laid-Open No. HEI 6-204792 discloses "Delay Circuit." In this application, the delay circuit provides a coarse adjusting section and a fine adjusting section, and adjusts the amount of delay by using a wide variable range and a fine minimum step.

At the third conventional example shown in FIG. 1, in order to form a middle phase at an interpolator, the sizes (on resistance values) of transistors are decided in the following. That is, the size of the transistors of the two step inverters B100 and B101, which generate the outputs a, is 10, and also the size of the transistors of the two step inverters B200 and B201, which generate the outputs c, is 10. And the size of transistor of the inverter B120 connecting to the input In1 whose phase is lead is set to be 6, and the size of transistor of the inverter B210 connecting to the input In2 whose phase is lag is set to be 4. And by connecting the outputs from the B120 and B210, the output b having the middle phase between the outputs a and c is obtained by mixing through the inverter B121 formed by the size of transistor being 10.

At this time, a phase lead signal in the two signals is inputted to the input In1, and even when the inverter B120, whose output is connected to the output of the inverter B210, changes, the inverter B210, to which a phase lag signal is inputted, stays unchanged. And since both a p channel transistor of the B120 and an n channel transistor of the B210 become "on", the output becomes a voltage divided value by the on resistance of the both transistors. Consequently, the phase lead input signal is delayed more than the value outputting from the two step inverters B100 and B101, and when the phase lag signal is inputted to the In2 and the B210 changes, the phase lead signal is changed immediately. Therefore, the phase lead signal changes faster than that the phase lag signal is outputted from the two step inverters B200 and B201. With this, a middle phase signal output can be obtained.

However, when the phase lead signal is inputted to the input In1, which is connected to the inverter B120 whose output is connected to the output of the inverter B210, that is, the both outputs are connected, the output load is heavy and the output is liable to be delayed. Therefore, in order to obtain the middle phase, the size of the transistor of the B120 is made to be larger than that of the B210 connecting the In2 for the phase lag signal input. Consequently, there is a limitation that the phase lead signal is always inputted to the input In1 for the phase lead signal input, in order to obtain the middle phase signal.

FIG. 2 is a block diagram showing the two step variable length delay circuit at the third conventional example. Referring to FIG. 2, a structure and an operation of the two step variable length delay circuit at the third conventional example are explained. Especially, the limitation mentioned above at the operation is explained.

As shown in FIG. 2, the two step variable length delay circuit at the third conventional example consists of a delay chain 601, a delay chain 602, a phase splitter 603, an end-of-cycle detector 604, a counter and control logic & selection logic 605, a 32:1 multiplexer 606, a three stage interpolator 607, a 16:1 multiplexer 608, a filter 609, and a phase detector 610.

As mentioned above, at the third conventional example, there is the limitation that the phase lead signal is always inputted to the input In1 for the phase lead signal input. Therefore, since the total number of taps of the delay chains 601 and 602 is 32, in order to make the number of inputs 32 be equal to two outputs, the 32:1 multiplexer 606 is required for the In1 for phase lead signal input and the In2 for phase lag signal input.

Under this structure, even when signals are extracted from the same tap, the routes where the signals are transmitted are different. Therefore, dispersion between the delay time from the input In1 for phase lead signal input to the output of the phase lead signal and the delay time from the input In2 for phase lag signal input to the output of the phase lag signal occurs. And the delay time of them does not become the same. That is, even when the same input is inputted to the inputs In1 and In2, there is a defect that the same delay time cannot be obtained. Consequently, when the tap outputs of the delay chains 601 and 602 are switched, there is a problem that a uniform time interval cannot be generated.

Further, wedge shaped pulses are generated at the delays at the 32:1 multiplexer 606 and the 3 stage interpolator 607. In order to solve this problem, it is necessary that both the inputs in1 and In2 are switched at the level 0, however, there is a problem that generating this timing is difficult.

At the fourth conventional example, as mentioned above, after the coarse adjustment was applied to the phase, the fine adjustment is applied to the phase. When a coarse adjusting tap is changed, a change of a coarse adjustment 1 tap is generated in the output, therefore there is a defect that the jitters of the output become large at an DLL that always adjusts. And the length of the fine adjustment is decided as the length of the 1 tap coarse adjustment, however, it cannot be executed that the fine adjustment range is made to be equal to the coarse adjustment 1 tape, by the dispersion. Even when the fine adjustment and the coarse adjustment are executed at the same time, there are problems that the phase changes of the equal interval cannot be realized and setting the switching timing is difficult.

At the fifth conventional example, the example does not have a structure in which the delay time is adjusted finely in wide range, and it is impossible to meet immediately a request in which the delay time is adjusted in a finer time interval. Further, it is impossible to constrain pulse shaped noise generated at the time when the unit delay circuit is switched.

At the sixth conventional example, the delay circuit is an analog circuit and it is difficult to design the circuit. When a coarse adjusting tap is changed, a change of a coarse adjustment 1 tap is generated in the output, therefore there is a defect that the jitters of the output become large at an DLL that always adjusts. And the length of the fine adjustment is decided as the length of the 1 tap coarse adjustment, however, it cannot be executed that the fine adjustment range is made to be equal to the coarse adjustment 1 tap, by the dispersion. Even when the fine adjustment and the coarse adjustment are executed at the same time, there are problems that the phase changes of the equal interval cannot be realized and setting the switching timing is difficult.

At the seventh conventional example, the delay circuit is an analog circuit and it is difficult to design the circuit. When a coarse adjusting tap is changed, a change of a coarse adjustment 1 tap is generated in the output, therefore there is a defect that the jitters of the output become large at an DLL that always adjusts.

And at the eighth conventional example, analog circuits are used and it is difficult to design the circuits. And the length of the fine adjustment is decided as the length of the 1 tap coarse adjustment, and the fine adjustment range is made to be equal to the coarse adjustment 1 tape, however, it is difficult to constrain pulse shaped noise generated at the time when the coarse adjusting section is switched, by the dispersion.

SUMMARY OF THE INVENTION

It is therefore an object of the present invention to provide a two step variable length, delay circuit, in which digital elements being able to make delay time variable easily are used, and its phase adjusting range is wide and can adjust the phase finely, and better jitter performance is realized, and pulse shaped noise (glitches) is prevented.

According to a first aspect of the present invention, there is provided a two step variable length delay circuit. At the two step variable length delay circuit, an input signal is delayed by a designated time interval every time when the input signal is passed through one of delay elements and plural delayed signals are generated, and m pieces of the plural delayed signals are selected and the selected m pieces of the plural delayed signals are made to be the first to the mth coarse adjustment delay signals (m is an integer being 3 or more), and the nth coarse adjustment delay signal has a more lead phase by a time interval dtc than the (n+1)th coarse adjustment delay signal has (n is an integer being 1 or more and (m−1) or less), and 2m pieces of fine adjustment delay signals are generated, based on signals, which the first to the mth coarse adjustment delay signal are amplified, and signals that waveforms of the nth and the (n+1)th coarse adjustment delay signals are mixed, and a signal that waveforms of the mth and the first coarse adjustment delay signals are mixed, and the jth fine adjustment delay signal has a more lead phase by a time interval dtc', being finer than the time interval dtc, than the (j+1)th fine adjustment delay signal has (j is an integer being 1 or more and (2m−2) or less), excluding a time interval between a fine adjustment delay signal generated from the mth and first coarse adjustment delay signals and the other fine adjustment delay signals, and in case that one of the 2m pieces of fine adjustment delay signals is selecting at present, and when the selecting fine adjustment delay signal is switched, one of the coarse adjustment delay signals excluding the coarse adjustment delay signal(s) using for generating selecting the fine adjustment delay signal is selected as the coarse adjustment delay signal to be switched.

According to a second aspect of the present invention, in the first aspect, the coarse adjustment delay signal to be switched is a coarse adjustment delay signal whose phase difference is the largest in coarse adjustment delay signal(s) from the coarse adjustment delay signal(s) using at the time when the fine adjustment delay signal, which is being selected at the time of switching, is generated, and further, a coarse adjustment delay signal, which is switched, in case that the phase difference between a fine adjustment delay signal that a coarse adjustment delay signal after switched is amplified and a fine adjustment delay signal that is selected after switching is smaller than the phase difference between the fine adjustment delay signal that the coarse adjustment delay signal to be switched is amplified and the fine adjustment delay signal that is being selected at the time of switching.

According to a third aspect of the present invention, in the first aspect, in case that the being selected fine adjustment delay signal is switched to a fine adjustment delay signal whose phase is more lead by the time interval dtc' than the phase of the being selected fine adjustment delay signal, as the coarse adjustment delay signal to be switched, a delayed input signal, whose phase is more lead by the time interval (m×dtc) than the phase of the coarse adjustment delay signal to be switched, is selected. And in case that the being selected fine adjustment delay signal is switched to a fine adjustment delay signal whose phase is more lag by the time interval dtc' than the phase of the being selected fine adjustment delay signal, as the coarse adjustment delay signal to be switched, a delayed input signal, whose phase is more lag by the time interval (m×dtc) than the phase of the coarse adjustment delay signal to be switched, is selected.

According to a fourth aspect of the present invention, there is provided a two step variable length delay circuit. The two step variable length delay circuit provides a delay means, in which three or more delay elements having delay time of a time interval of dtc are connected in series, and which outputs each output from the delay elements, whose phase is delayed by the time interval dtc from the phase of an output of a delay element of a previous stage, as that the side to which an input signal is inputted is made to be the previous stage, a first selection means that selects the outputs of m pieces of the delay elements from the outputs of the delay elements (m is an integer being 3 or more), a waveform mixing means RIa, which outputs the first to the (2m−1)th signal outputs that the outputs of the m pieces delay elements are amplified, and outputs each signal, whose phase is middle between the nth (n is an integer being 1 or more and (m−1) or less) input and the (n+1)th input, is generated by that waveforms of the nth input and the (n+1)th input, whose phase difference between them is the time difference dtc, are mixed, and also outputs a signal, whose phase is middle between the first input and the mth input, is generated by that waveforms of the first input and the mth input are mixed, and a second selection means that selects one of the outputs from the waveform mixing means RIa. And when the output from the waveform mixing means RIa, being selected by the second selection means, is switched to another output, an output from one of the delay elements, which is not used at the time when the being selected output from the waveform mixing means RIa is generated, is used as another output.

According to a fifth aspect of the present invention, in the fourth aspect, at the waveform mixing means RIa, an output amplified the phase of the nth input is made to be the (2n−1)th output, an output amplified the phase of the mth input is made to be the (2m−1)th output, an output that the waveforms of the nth input and the (n+1)th input are mixed is made to be the 2nth output, an output that the waveforms of the mth input and the first input are mixed is made to be the 2mth output, and the phase difference between the jth output (j is an integer being 1 or more and (2m−2) or less) and the (j+1)th output is (dtc/2). And when an output from the delay elements is selected so that an input whose phase is more lead by the time interval dtc is inputted to the mth input than the phase of the first input, the phase difference between the (2m−1)th output and the 2mth output becomes the time interval (dtc/2).

According to a sixth aspect of the present invention, in the fourth aspect, the waveform mixing means RIa is a ring interpolator RIa. And the ring interpolator RIa provides m pieces of buffers that amplify each of the inputs from the first to the mth inputs, (m−1) pieces of interpolators IPx (x is an integer being 1 or more and (m−1) or less), and the mth interpolator IPm. And at each of the (m−1) pieces of the interpolators IPx, the nth input is inputted to its phase lead input and the (n+1)th input is inputted to its phase lag input, and each of the (m−1) pieces of the interpolators IPx amplifies the nth input and the (n+1)th input and connects both the amplified inputs and generates an output whose phase is middle between the phases of the nth and the (n+1)th inputs by mixing waveforms of both the inputs. And at the mth interpolator IPm, in which the mth input is inputted to its phase lead input and the first input is inputted to its phase lag input, the interpolators IPm amplifies the mth input and the first input and connects both the amplified inputs and generates an output whose phase is middle between the phases of the mth and the first inputs by mixing waveforms of both the inputs.

According to a seventh aspect of the present invention, in the fourth aspect, each of the delay elements is a digital circuit that has delay time of the time interval dtc.

According to an eighth aspect of the present invention, in the fourth aspect, the two step variable length delay circuit further provides a first control means that sends a first selection signal, which makes the first selection means select the m pieces of outputs of delay elements from the outputs of the delay elements, and a second control means that sends a second selection signal, which makes the second selection means select the one piece of outputs of the waveform mixing means RIa from the outputs of the waveform mixing means RIa.

According to a ninth aspect of the present invention, in the eighth aspect, when the first control means receives a first delaying signal that makes the output from the waveform mixing means RIa being selected by the second selection means switch to an output having more phase lead of the waveform mixing means RIa, the first control means makes an output of the delay element that is not using at the time when the waveform mixing means RIa is generating the selected output be an output from the delay element to be switched, and the first control means makes the first selection means switch to an output from the delay element whose phase is lead by the time interval (m×dtc), and controls the first selection means so that the first selection means selects m pieces of sequential outputs from the delay elements.

According to a tenth aspect of the present invention, in the ninth aspect, the output from the delay element to be switched, when the first delaying signal was received, is, an output from the delay element whose phase difference is the largest from the outputs of the delay elements using at the time when the output from the waveform mixing means RIa is generated, which is being selected at the time of switching by the second selection means, and further, an output from the delay element that is switched, in case that the phase difference between an output from the waveform mixing means RIa that an output of a delay element after switching is amplified and an output from the waveform mixing means RIa selecting after switched is smaller than the phase difference between an output from the waveform mixing means RIa that the output of the delay element to be switched is amplified and the output from the waveform mixing means RIa that are being selected at the time of switching.

According to an eleventh aspect of the present invention, in the ninth aspect, in case that the pth output (p is an integer being 2 or more and 2m or less) from the waveform mixing means RIa is being selected by the second selection means, and the second control means received the first delaying signal, the second control means controls the second selection means so that the second selection means switches the pth output from the waveform mixing means RIa to the (p−1)th output from the waveform mixing means RIa. And in case that the first output from the waveform mixing means RIa is being selected by the second selection means, and the second control means received the first delaying signal, the second control means controls the second selection means so that the second selection means switches the first output from the waveform mixing means RIa to the 2mth output from the waveform mixing means RIa.

According to a twelfth aspect of the present invention, in the eighth aspect, when the first control means receives a first advancing signal that makes the output from the waveform mixing means RIa being selected by the second selection means switch to an output having more phase lag of the waveform mixing means RIa, the first control means makes an output of the delay element that is not using at the time when the waveform mixing means RIa is generating the selected output be an output from the delay element to be switched, and the first control means makes the first selection means switch to an output from the delay element whose phase is lag by the time interval (m×dtc), and controls the first selection means so that the first selection means selects m pieces of sequential outputs from the delay elements.

According to a thirteenth aspect of the present invention, in the twelfth aspect, the output from the delay element to be switched, when the first advancing signal was received, is, an output from the delay element whose phase difference is the largest from the outputs of the delay elements using at the time when the output from the waveform mixing means RIa is generated, which is being selected at the time of switching by the second selection means, and further, an output from the delay element that is switched, in case that the phase difference between an output from the waveform mixing means RIa that an output of a delay element after switching is amplified and an output from the waveform mixing means RIa selecting after switched is smaller than the phase difference between an output from the waveform mixing means RIa that the output of the delay element to be switched is amplified and the output from the waveform mixing means RIa that are being selected at the time of switching.

According to a fourteenth aspect of the present invention, in the twelfth aspect, in case that the qth output (q is an integer being 1 or more and (2m−1) or less) from the waveform mixing means RIa is being selected by the second selection means, and the second control means received the first advancing signal, the second control means controls the second selection means so that the second selection means switches the qth output from the waveform mixing means RIa to the (q+1)th output from the waveform mixing means RIa. And in case that the 2mth output from the waveform mixing means RIa is being selected by the second selection means, and the second control means received the first advancing signal, the second control means controls the second selection means so that the second selection means switches the 2mth output from the waveform mixing means RIa to the first output from the waveform mixing means RIa.

According to a fifteenth aspect of the present invention, in the fourth aspect, the two step variable length delay circuit further provides r pieces of waveform mixing means (r is an integer being 1 or more), which are connected in series and disposed between the waveform mixing means RIa and the second selection means.

According to a sixteenth aspect of the present invention, in the fifteenth aspect, in case that the output side of the waveform mixing means RIa, to which one of the r pieces of the waveform mixing means is connected, is defined as a previous stage, and the input side of the second selection means is defined as a next stage, at the sth (s is an integer being 1 or more and r or less) waveform mixing means in the r pieces of the waveform mixing means, by counting from the previous stage. And in case that the outputs of the m delay elements, selected by the first selection means, are inputted to the first to the mth input of the waveform mixing means RIa in phase lead order, the first to the $(m \times 2^s)$ outputs from the previous waveform mixing means are inputted to the first to the $(m \times 2^s)$ inputs of the sth waveform mixing means respectively, and the outputs, which the first to the $(m \times 2^{s+1}-1)$ outputs were amplified, are made to be the first to the $(m \times 2^s)$ inputs, and the output, which waveforms of the tth input (t is an integer being 1 or more and $(m \times 2^s-1)$ or less) and the (t+1)th input are mixed, is made to be the 2tth output, and the output, which waveforms of the $(m \times 2^s)$th input and the first input are mixed, is made to be the $(m \times 2^{s+1})$ output. And in case that the time interval between the nth input (n is an integer being 1 or more and (m−1) or less) and the (n+1)th input being the outputs from the m delay elements selected by the first selection means is (dtc), the phase difference between the tth input and the (t+1)th input is the time interval $(dtc/2^s)$ in the range that the t is 1 to $(2^s \times (m-1)+1)$, and the phase difference between the uth output and the (u+1)th output is the time interval $(dtc/2^{s+1})$ in the range that the u is 1 to $(2^{s+1} \times (m-1)+1)$. And when the phase of the mth input being the output from the mth delay element selected by the first selection means becomes more lead than the phase of the first input, the phase difference between the tth input and the (t+1)th input is the time interval (dtc/$2^S$) in the range that the t is ($2^S \times (m-1)+1$) to ($m \times 2^S$), and the phase difference between the uth output and the (u+1)th output is the time interval (dtc/$2^{S+1}$) in the range that the u is ($2^{S+1} \times (m-1)+1$) to ($m \times 2^{S+1}$).

According to a seventeenth aspect of the present invention, in the sixteenth aspect, the sth waveform mixing means in the r pieces of the waveform mixing means is a ring interpolator. And the sth waveform mixing means provides ($m \times 2^S$) pieces of buffers that amplify each of the inputs from the first to the ($m \times 2^S$)th, ($m \times 2^S - 1$) pieces of interpolators ipy (y is an integer being 1 or more and ($m \times 2^S - 1$) or less), and an interpolator ip ($m \times 2^S$). And at each of the ($m \times 2^S - 1$) pieces of interpolators ipy, the tth input is inputted to its phase lead input and the (t+1)th input is inputted to its phase lag input, and each of the ($m \times 2^S - 1$) pieces of interpolators ipy amplifies the tth input and the (t+1)th input and connects both the amplified outputs and generates an output whose phase is middle between the phases of the tth and the (t+1)th inputs by mixing waveforms of both the outputs. And at the interpolator ip ($m \times 2^S$), in which the ($m \times 2^S$)th input is inputted to its phase lead input and the first input is inputted to its phase lag input, and the interpolator ip ($m \times 2^S$) amplifies the ($m \times 2^S$)th input and the first input and connects both the amplified outputs and generates an output whose phase is middle between the phases of the ($m \times 2^S$)th and the first inputs by mixing waveforms of both the outputs.

According to an eighteenth aspect of the present invention, in the fifteenth aspect, the second selection means selects one of the outputs from the last waveform mixing means in the r pieces of the waveform mixing means connecting to the second selection means, in case that the r pieces of waveform mixing means, which are connected in series, are disposed between the waveform mixing means RIa and the second selection means.

According to a nineteenth aspect of the present invention, in the eighteenth aspect, when the first control means receives a second delaying signal that makes the output from the last waveform mixing means being selected by the second selection means switch to an output having more phase lead of the last waveform mixing means, the first control means makes an output of the delay element that is not using at the time when the last waveform mixing means is generating the selected output be an output from the delay element to be switched, and the first control means makes the first selection means switch to an output from the delay element whose phase is lead by the time interval (m×dtc), and controls the first selection means so that the first selection means selects m pieces of sequential outputs from the delay elements.

According to a twentieth aspect of the present invention, in the nineteenth aspect, the output from the delay element to be switched, when the second delaying signal was received, is, an output from the delay element whose phase difference is the largest from the outputs of the delay elements using at the time when the output from the last waveform mixing means is generated, which is being selected at the time of switching by the second selection means, and further, an output from the delay element that is switched, in case that the phase difference between an output from the last waveform mixing means that an output of a delay element after switching is amplified and an output from the last waveform mixing means selecting after switched is smaller than the phase difference between an output from the last waveform mixing means that the output of the delay element to be switched is amplified and the output from the last waveform mixing means that are being selected at the time of switching.

According to a twenty-first aspect of the present invention, in the nineteenth aspect, in case that the fth output (f is an integer being 2 or more and ($m \times 2^{S+1}$) or less) from the last waveform mixing means is being selected by the second selection means, and the second control means received the second delaying signal, the second control means controls the second selection means so that the second selection means switches the fth output from the last waveform mixing means to the (f−1)th output from the last waveform mixing means.

According to a twenty-second aspect of the present invention, in the nineteenth aspect, in case that the first output from the last waveform mixing means is being selected by the second selection means, and the second control means received the second delaying signal, the second control means controls the second selection means so that the second selection means switches the first output from the last waveform mixing means to the ($m \times 2^{S+1}$)th output from the last waveform mixing means.

According to a twenty-third aspect of the present invention, in the eighteenth aspect, when the first control means receives a second advancing signal that makes the output from the last waveform mixing means being selected by the second selection means switch to an output having more phase lag of the last waveform mixing means, the first control means makes an output of the delay element that is not using at the time when the last waveform mixing means is generating the selected output be an output from the delay element to be switched, and the first control means makes the first selection means switch to an output from the delay element whose phase is lag by the time interval (m×dtc), and controls the first selection means so that the first selection means selects m pieces of sequential outputs from the delay elements.

According to a twenty-fourth aspect of the present invention, in the twenty-third aspect, the output from the delay element to be switched, when the second advancing signal was received, is, an output from the delay element whose phase difference is the largest from the outputs of the delay elements using at the time when the output from the last waveform mixing means is generated, which is being selected at the time of switching by the second selection means, and further, an output from the delay element that is switched, in case that the phase difference between an output from the last waveform mixing means that an output of a delay element after switching is amplified and an output from the last waveform mixing means selecting after switched is smaller than the phase difference between an output from the last waveform mixing means that the output of the delay element to be switched is amplified and the output from the last waveform mixing means that are being selected at the time of switching.

According to a twenty-fifth aspect of the present invention, in the twenty-third aspect, in case that the gth output (g is an integer being 1 or more and ($m \times 2^{S+1} - 1$) or less) from the last waveform mixing means is being selected by the second selection means, and the second control means received the second advancing signal, the second control means controls the second selection means so that the second selection means switches the gth output from the last waveform mixing means to the (g+1)th output from the last waveform mixing means.

According to a twenty-sixth aspect of the present invention, in the twenty-third aspect, in case that the $(m \times 2^{S+1})$th output from the last waveform mixing means is being selected by the second selection means, and the second control means received the second advancing signal, the second control means controls the second selection means so that the second selection means switches the $(m \times 2^{S+1})$th output from the last waveform mixing means to the first output from the last waveform mixing means.

According to a twenty-seventh aspect of the present invention, in the sixth aspect, when two signals whose phases are different each other are inputted to the ring interpolator RIa, and in case that a phase lead signal is inputted to a buffer B3 and a phase lag signal is inputted to a buffer B4, and the interpolator IPx and the interpolator IPm provide a buffer B1 to which the phase lead signal is inputted and a buffer B2 to which the phase lag signal is inputted, on resistance values of transistors of the buffers B1 and B2 are decided so that the phase of the output, which the outputs from the buffers B1 and B2 are connected and their waveforms are mixed, becomes the middle phase between the phase of the output from the buffer B3, the phase lead signal was amplified, and the phase of the output from the buffer B4, the phase lag signal was amplified.

According to a twenty-eighth aspect of the present invention, in the seventeenth aspect, when two signals whose phases are different each other are inputted to the ring interpolator, and in case that a phase lead signal is inputted to a buffer B3 and a phase lag signal is inputted to a buffer B4, and the interpolator ipy and the interpolator ip $(m \times 2^S)$ provide a buffer B1 to which the phase lead signal is inputted and a buffer B2 to which the phase lag signal is inputted, on resistance values of transistors of the buffers B1 and B2 are decided so that the phase of the output, which the outputs from the buffers B1 and B2 are connected and their waveforms are mixed, becomes the middle phase between the phase of the output from the buffer B3, the phase lead signal was amplified, and the phase of the output from the buffer B4, the phase lag signal was amplified.

According to a twenty-ninth aspect of the present invention, in the twenty-seventh and the twenty-eighth aspects, each of the buffers B1, B2, B3, and B4 is an amplifier or an inverter.

BRIEF DESCRIPTION OF THE DRAWINGS

The objects and features of the present invention will become more apparent from the consideration of the following detailed description taken in conjunction with the accompanying drawings in which:

FIG. 5 is a circuit diagram and a logic circuit diagram showing a first example of an interpolator shown in FIG. 4;

FIG. 6 is a circuit diagram and a logic circuit diagram showing a second example of the interpolator shown in FIG. 4;

FIG. 8 is a circuit diagram and a logic circuit diagram showing a fourth example of the interpolator shown in FIG. 4;

DESCRIPTION OF THE PREFERRED EMBODIMENTS

Figure 1:
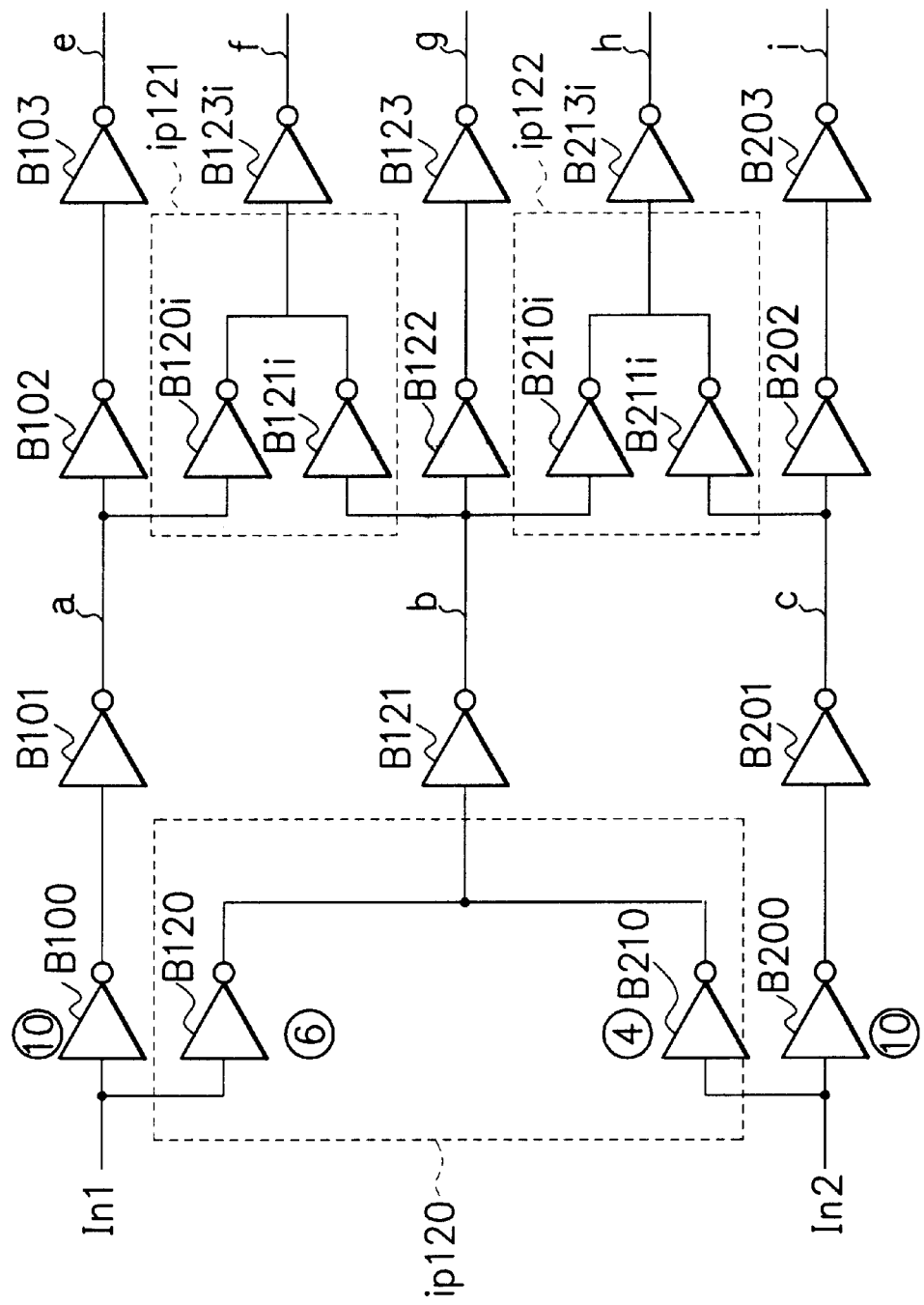
FIG. 1 is a circuit diagram showing a two step variable length delay circuit including interpolators at the third conventional example.
Figure 2:
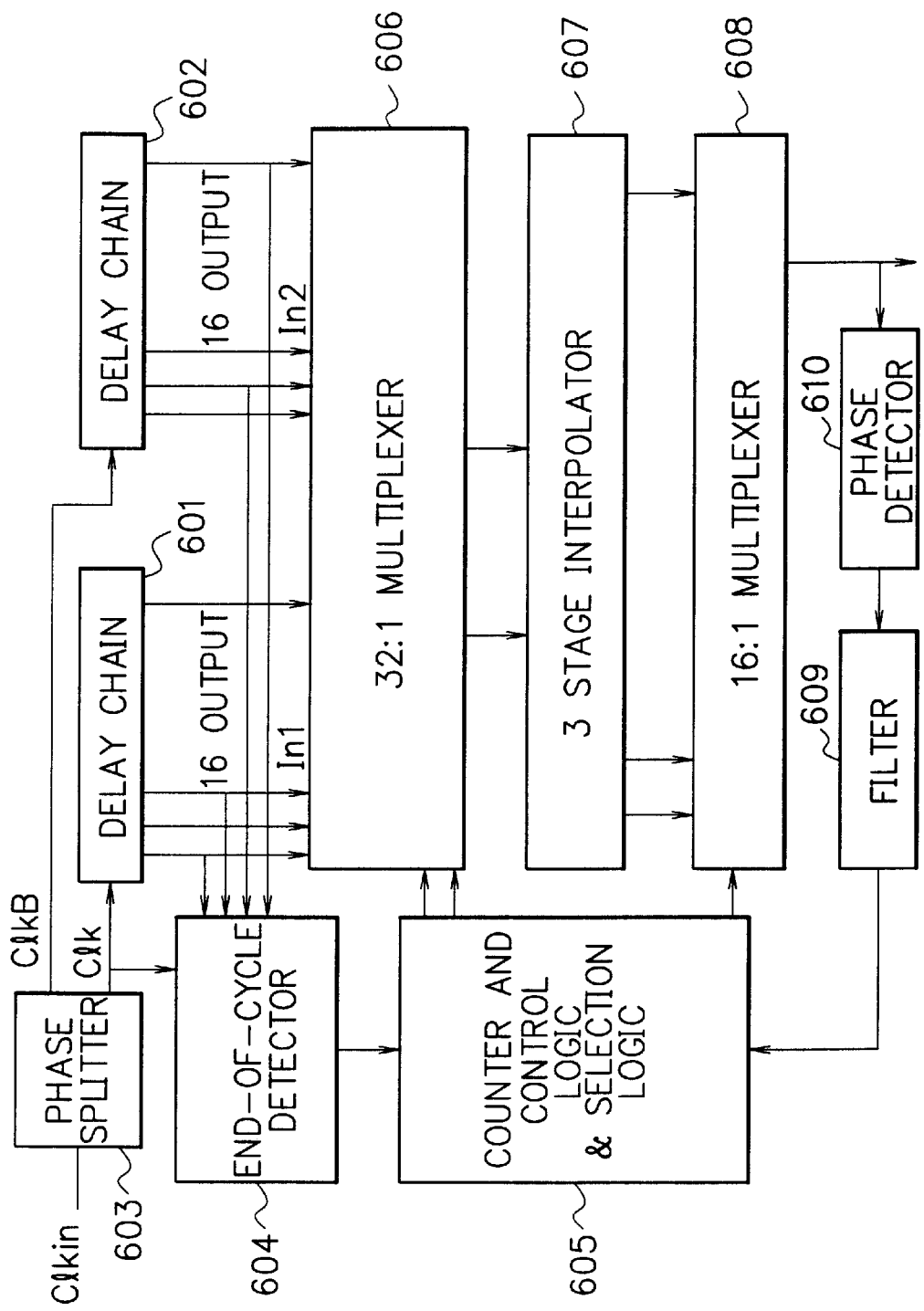
FIG. 2 is a block diagram showing the two step variable length delay circuit at the third conventional example.
Figure 3:
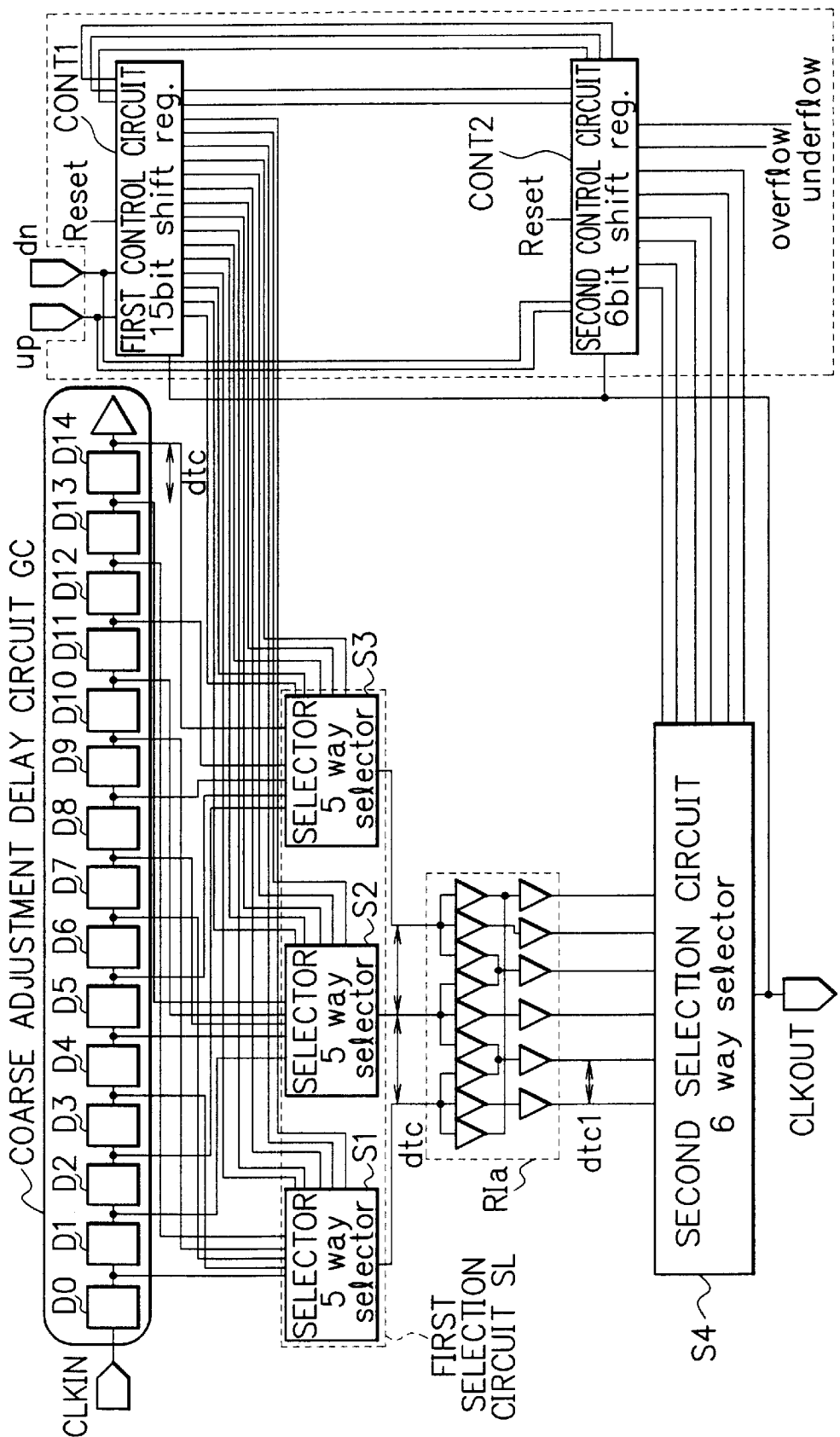
FIG. 3 is a block diagram showing a two step variable length delay circuit at a first embodiment of the present invention.

Referring now to the drawings, embodiments of the present invention are explained in detail. FIG. 3 is a block diagram showing a two step variable length delay circuit at a first embodiment of the present invention. Referring to FIG. 3, the structure and the function of each element at the two step variable length delay circuit at the first embodiment of the present invention are explained.

As shown in FIG. 3, the two step variable length delay circuit at the first embodiment of the present invention provides a coarse adjustment delay circuit GC (gate chain) being a delay means, a first ring interpolator RIa being a wave mixing means, a first selection circuit SL, a second selection circuit S4, a first control circuit CONT1, and a second control circuit CONT2.

The coarse adjustment delay circuit GC provides plural delay elements D0 to D14 composed of a digital circuit having delay time of a time interval dtc, and 15 taps being output terminals of the delay elements D0 to D14. And an input CLKIN is inputted to the coarse adjustment delay circuit GC.

The phase of the input CLKIN delays by the time interval dtc every time when the input CLKIN passes through one delay element. For example, the phase of the output of the delay element D5 delays by the time intervals (5×dtc) from the phase of the output of the delay element D0.

The first selection circuit SL provides a selector S1, a selector S2, and a selector S3, and each selector is a 5 way selector. Each output from the delay elements D0 to D14 is connected to each respective selector S1, S2, or S3 every three outputs. Each of the selectors S1 to S3 respectively selects the output from one delay element. For example, three outputs from the delay elements D3, D4, and D5 are selected sequentially by the selectors S1, S2, and S3.

The first ring interpolator RIa, to which the outputs from the delay elements selected by the three selectors S1 to S3 are inputted, provides three interpolators and buffers. A first interpolator mixes waveforms of the outputs from the selectors S1 and S2. A second interpolator mixes waveforms of the outputs from the selectors S2 and S3. And a third interpolator mixes waveforms of the outputs from the selectors S1 and S3. The buffers amplify the outputs from the selectors S1 to S3. In this, further, buffers, which amplify the outputs from the buffers and interpolators, can be provided. Hereinafter, the inputs to the first ring interpolator RIa are referred to as RIa inputs, and the outputs from the first ring interpolator RIa are referred to as RIa outputs.

Figure 4:
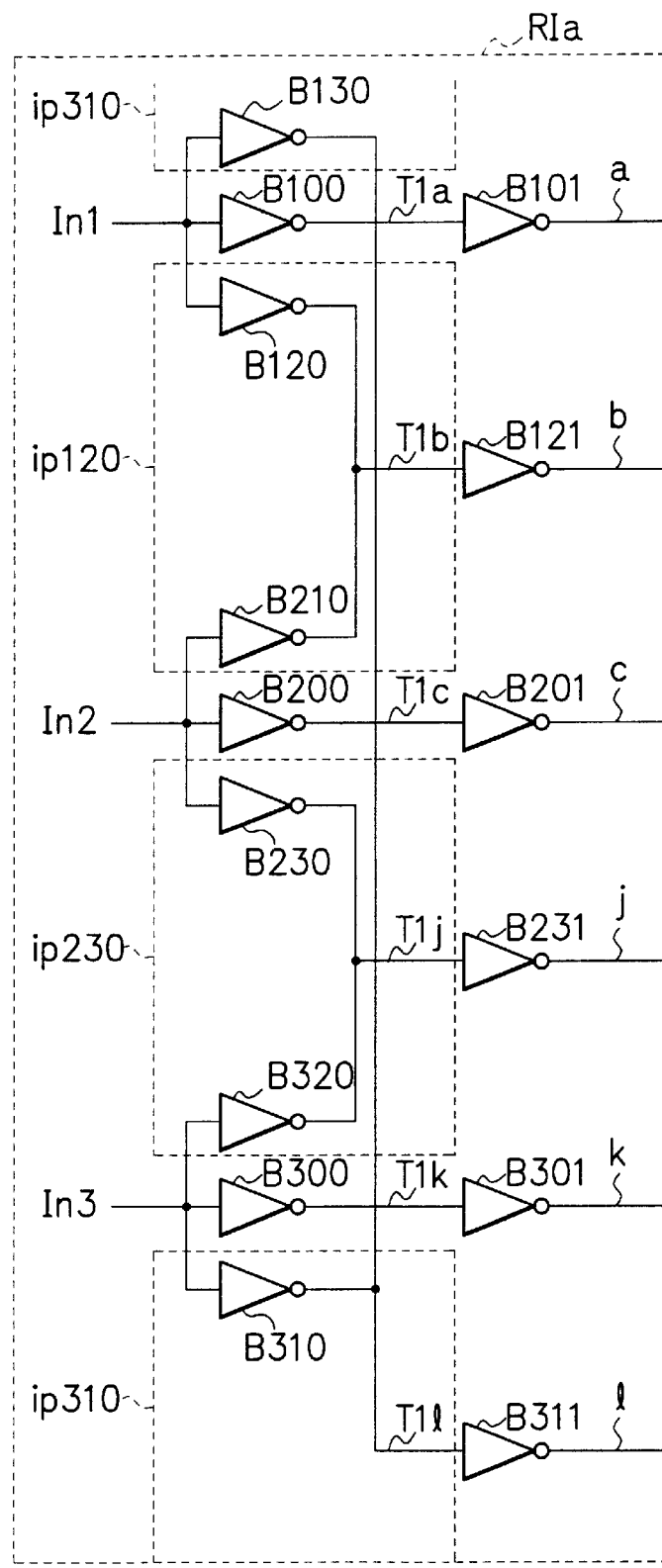
FIG. 4 is a circuit diagram showing a structure of a first ring interpolator shown in FIG. 3.

FIG. 4 is a circuit diagram showing a structure of the first ring interpolator RIa shown in FIG. 3. Referring to FIG. 4, the structure of the first ring interpolator RIa is explained in detail. In this, each function in the embodiments of the present invention has the same reference number that the conventional example has, in case that the function is almost equal in both.

As shown in FIG. 4, the first ring interpolator RIa provides an interpolator ip120, an interpolator ip230, an interpolator ip310, buffers B100, B200, and B300, inputs In1 to In3, and outputs T1a, T1b, T1c, T1j, T1k, and T1l. Further, the first ring interpolator RIa can provide buffers B101, B121, B201, B231, B301, and B311 that amplify the respective outputs T1a, T1b, T1c, T1j, T1k, and T1l, and output a, b, c, j, k, and l.

The interpolator ip120 provides buffers B120 and B210, and outputs the output T1b that waveforms of the outputs from the buffers B120 and B210 were mixed. The interpolator ip230 provides buffers B230 and B320, and outputs the output T1j that waveforms of the outputs from the buffers B230 and B320 were mixed. And the interpolator ip310 provides buffers B310 and B130, and outputs the output T1l that waveforms of the outputs from the buffers B310 and B130 were mixed.

Referring to FIGS. 3 and 4, the second selection circuit S4, the first control circuit CONT1, and the second control circuit CONT2 are explained.

The second selection circuit S4 being a 6 way selector selects one of the RIa outputs T1a, T1b, T1c, T1j, T1k, and T1l, or selects one of the RIa outputs a, b, c, j, k, and l that the outputs T1a to T1l were amplified at the buffers.

The first control circuit CONT1 sends a first selection signal that makes the selectors S1 to S3 select three sequential outputs from the outputs of the delay elements D0 to D14 in the coarse adjustment delay circuit GC.

In case that the first control circuit CONT1 received a delaying signal "up" that switches the RIa output selecting by the second selection circuit S4 to an RIa output having more lead phase, the first control circuit CONT1 controls the first selection circuit SL so that the first selection circuit SL switches one of the three outputs from the delay elements selecting by the first selection circuit SL. In this, the RIa output is one of the RIa outputs T1a to T1l, or a to l.

And in case that the first control circuit CONT1 received an advancing signal "dn" that switches the RIa output selecting by the second selection circuit S4 to an RIa output having more lag phase, the first control circuit CONT1 controls the first selection circuit SL so that the first selection circuit SL switches one of the three outputs from the delay elements selecting by the first selection circuit SL.

The second control circuit CONT2 controls the second selection circuit S4, by sending a second selection signal, which makes the second selection circuit S4 select one output from the outputs from the first ring interpolator RIa, to the second selection circuit S4.

In case that the second control circuit CONT2 received the delaying signal "up", the second control circuit CONT2 sends a selection signal, which makes the second selection circuit S4 switch to select more lead phase RIa output, to the second selection circuit S4. And in case that the second control circuit CONT2 received the advancing signal "dn", the second control circuit CONT2 sends a selection signal, which makes the second selection circuit S4 switch to select more lag phase RIa output, to the second selection circuit S4.

Next, referring to FIGS. 3 and 4, the operation of the two step variable length delay circuit at the first embodiment of the present invention is explained.

The phase of the input CLKIN delays by the time interval dtc every time when the input CLKIN passes through one of the delay elements in the coarse adjustment delay circuit GC. Therefore, the coarse adjustment delay circuit GC obtains the output from the delay element D0, whose phase is delayed by the time interval (dtc) from the input CLKIN, and also obtains the outputs from the delay elements D1 to D14, whose phases are delayed by the time interval (dtc) from the phase of the output of each previous delay element.

The first selection circuit SL provides the three selectors S1 to S3. The selector S1 selects one output from the outputs of the delay elements D0, D3, D6, D9, and D12 being every three outputs from the delay element D0 in the coarse adjustment delay circuit GC, by receiving the first selection signal from the first control circuit CONT1.

The selector S2 selects one output from the outputs of the delay elements D1, D4, D7, D10, and D13 being every three outputs from the delay element D1 in the coarse adjustment delay circuit GC, by receiving the first selection signal from the first control circuit CONT1.

And the selector S3 selects one output from the outputs of the delay elements D2, D5, D8, D11, and D14 being every three outputs from the delay element D2 in the coarse adjustment delay circuit GC, by receiving the first selection signal from the first control circuit CONT1.

The first control circuit CONT1 sends the first selection signal that makes the selectors S1 to S3 select three sequential outputs from the delay elements D0 to D14 in the coarse adjustment delay circuit GC.

The first ring interpolator RIa makes the three outputs from the delay elements selected by the selectors S1 to S3 be the RIa inputs In1 to In3.

The input signal inputted to the input In1 of the first ring interpolator RIa is inputted to the buffers B100, B120, and B130, and amplified at the buffers. The inputted signal amplified at the buffer B100 becomes the RIa output T1a.

The input signal inputted to the input In2 of the first ring interpolator RIa is inputted to the buffers B200, B210, and B230, and amplified at the buffers. The inputted signal amplified at the buffer B200 becomes the RIa output T1c.

And the input signal inputted to the input In3 of the first ring interpolator RIa is inputted to the buffers B300, B310, and B320, and amplified at the buffers. The inputted signal amplified at the buffer B300 becomes the RIa output T1k.

Next, the operation of each of the interpolators ip120, ip230, and ip310 is explained. When two input signals, whose phases are different each other, are inputted to the interpolator ip120, an input signal whose phase is lead is inputted to the RIa input In1, and an input signal whose phase is lag is inputted to the RIa input In2. At this time, the interpolator ip120 mixes waveforms of the output from the buffer B120 to which the input signal having the lead phase was inputted and amplified and the output from the buffer B210 to which the input signal having the lag phase was inputted and amplified. The sizes (on resistance values) of transistors of the buffers B120 and B210 are decided so that the phase of the RIa output T1b becomes the middle phase between the phase of the RIa output T1a from the buffer B100 and the phase of the RIa output T1c from the buffer B200. And the signal outputting from the RIa output T1b obtains the middle phase between the phases of the signals outputting from the RIa outputs T1a and T1c.

When two input signals, whose phases are different each other, are inputted to the interpolator ip230, an input signal whose phase is lead is inputted to the RIa input In2, and an input signal whose phase is lag is inputted to the RIa input In3. At this time, the interpolator ip230 mixes waveforms of the output from the buffer B230 to which the input signal having the lead phase was inputted and amplified and the output from the buffer B320 to which the input signal having the lag phase was inputted and amplified. The sizes of transistors of the buffers B230 and B320 are decided so that the phase of the RIa output T1j becomes the middle phase, between the phase of the RIa output T1c from the buffer B200 and the phase of the RIa output T1k from the buffer B300. And the signal outputting from the RIa output T1j obtains the middle phase between the phases of the signals outputting from the RIa outputs T1c and T1k.

When two input signals, whose phases are different each other, are inputted to the interpolator ip310, an input signal whose phase is lead is inputted to the RIa input In3, and an input signal whose phase is lag is inputted to the RIa input In1. At this time, the interpolator ip310 mixes waveforms of the output from the buffer B310 to which the input signal having the lead phase was inputted and amplified and the output from the buffer B130 to which the input signal having the lag phase was inputted and amplified. The sizes of transistors of the buffers B310 and B130 are decided so that the phase of the RIa output T1l becomes the middle phase between the phase of the RIa output T1k from the buffer B300 and the phase of the RIa output T1a from the buffer B100. And the signal outputting from the RIa output T1l obtains the middle phase between the phases of the signals outputting from the RIa outputs T1k and T1a.

The following outputs can be obtained. That is, the RIa outputs T1a, T1b, T1c, T1j, T1k, and T1l are amplified again in the respective buffers B101, B121, B201, B231, B301, and B311, and the RIa outputs a, b, c, j, k, and l are outputted.

The second selection circuit S4 selects one of the RIa outputs T1a, T1b, T1c, T1j, T1k, and T1l, or one of the outputs a, b, c, j, k, and l, which were amplified again in the respective buffers, corresponding to the second selection signal from the second control circuit CONT2.

The second control circuit CONT2 controls the second selection circuit S4, by sending the second selection signal by which the second selection circuit S4 selects one of the outputs from the first ring interpolator RIa.

FIG. 5 is a circuit diagram and a logic circuit diagram showing a first example of the interpolator shown in FIG. 4. In FIG. 5(a), the circuit diagram of the first example of the interpolator is shown, and in FIG. 5(b), the logic circuit diagram of the first example of the interpolator is shown. In FIG. 5, the interpolator ip120 shown in FIG. 4 is shown. At the first embodiment of the present invention, as shown in FIG. 5, the buffers B120 and B210 are composed of a CMOS circuit combined an nMOS transistor and a pMOS transistor.

Referring to FIGS. 4 and 5, the operation of waveform mixing by the interpolator ip120 is explained.

Since the same size transistor is used for the buffer B100 connected to the RIa input In1 and output T1a and the buffer B200 connected to the RIa input In2 and output T1c, the delay time from the RIa input In1 to the output T1a and the delay time from the RIa input In2 to the output T1c is the same. Therefore, the phase difference between the signal of the RIa output T1a and the signal of the RIa output T1c becomes the same phase difference between the signal inputted to the RIa input In1 and the signal inputted to the RIa input In2.

The interpolator ip120 mixes the waveforms of the output from the buffer B120 connecting to the RIa input In1 to which the input signal having a lead phase is inputted and the output from the buffer B210 connecting to the RIa input In2 to which the input signal having a lag phase is inputted by connecting the outputs from the buffers B120 and B210.

In case that the state of one of the two input signals whose phases are different is "0", and the state of the other of the two input signals is "1", the pMOS transistor of one of the buffers B120 and B210 and the nMOS transistor of the other turn on at the same time, and "on" resistance is generated in the both transistors.

As mentioned above, when the input signal having the lead phase is inputted to the RIa input In1 of the buffer B120, the transition period phenomenon of the output from the buffer B120 is non-linear, and its load is heavy. Therefore, there is a tendency that the phase of the output from the buffer B120 becomes lag.

In order to solve this, the size of the transistors of the buffer B120 connecting to the RIa input In1 to which the input signal having the lead phase is inputted is decided to be larger than the size of the transistors of the buffer B210 connecting to the RIa input In2 to which the input signal having the lag phase is inputted. With this, the resistance value of the buffer B120 becomes smaller than that of the buffer B210.

When the pMOS transistor of one of the buffers B120 and B210 and the nMOS transistor of the other of the buffers B120 and B210 turn on at the same time, based on the relation of the resistance values mentioned above, the voltage of the waveform mixed RIa output T1b becomes the voltage connected to the transistor being on of the buffer B120 or a value close to the ground.

In case that the input signal inputted to the buffer B120 is "0" and the input signal inputted to the buffer B210 is "1", the output value from the buffer B120 becomes "1" and the output value from the buffer B210 becomes "0". And the waveform mixed RIa output T1b becomes a middle value and its phase becomes a more lag phase than the RIa output T1a.

And when the input signal having the lag phase is inputted to the RIa input In2 delayed after the timing when the input signal having the lead phase is outputted from the buffer B120 and the output value of the buffer B210 changes to "1", the RIa output T1b changes to "1" from the middle value rapidly. Consequently, the input signal having the lag phase at the RIa output T1b changes to "1" before the RIa output T1c via the buffer B200 becomes "1". Further, the RIa output T1b having the middle phase between the RIa output T1a and the RIa output T1c can be obtained by adjusting the sizes of transistors in the buffers B120 and B210.

The interpolators ip230 and ip310 have the same structure that the interpolator ip120 has, and obtain an output having the middle phase between two outputs amplified at the buffers.

In case that the selectors S1 to S3 in the first selection circuit SL select the most lead phase input signal to the RIa input In1 and the most lag phase input signal to the RIa input In3 from the outputs of the coarse adjustment delay circuit GC, at the first ring interpolator RIa, the RIa output T1a, which the signal inputted to the RIa input In1 was amplified at the buffer B100, has the most lead phase, and the RIa output T1k, which the signal inputted to the RIa input In3 was amplified at the buffer B300, has the most lag phase.

At this time, the RIa input In1 and the RIa input In3 are separated by 2 output taps of the coarse adjustment delay circuit GC, and at the interpolator ip310, the input signal having the lead phase is inputted to the RIa input In3, and the input signal having the lag phase is inputted to the RIa input In1. That is, the input signals are inputted in reverse to the interpolator ip310, compared with the case of the interpolator ip120. Therefore, the interpolator ip310 cannot obtain a fine time interval output and an output having a middle phase between the RIa input In3 and the RIa input In1.

For example, a case is studied. The case is that the first selection circuit SL selects the outputs from the delay elements D4, D5, and D6, as the inputs to the first ring interpolator RIa, and the output from the delay element D4 is selected to the input to the RIa input In1, the output from the delay element D5 is selected to the input to the RIa input In2, and the output from the delay element D6 is selected to the input to the RIa input In3.

At the case that the inputs to the first ring interpolator RIa are selected as mentioned above, the outputs a, b, c, j, k, and l from the first ring interpolator RIa are set as follows. The RIa output a is set to be the output that the output from the delay element D4 was passed through the two buffers. The output from the delay element D4, passed through one buffer, and the output from the delay element D5, passed through the other buffer, were connected and waveforms of these two outputs were mixed, further the mixed waveform was passed through a buffer, this amplified mixed waveform is set to be the RIa output b. The RIa output c is set to be the output that the output from the delay element D5 was passed through the two buffers. The output from the delay element D5, passed through one buffer, and the output from the delay element D6, passed through the other buffer, were connected and waveforms of these two outputs were mixed, further the mixed waveform was passed through a buffer, this amplified mixed waveform is set to be the RIa output j. The RIa output k is set to be the output that the output from the delay element D6 was passed through the two buffers. The output from the delay element D6, passed through one buffer, and the output from the delay element D4, passed through the other buffer, were connected and waveforms of these two outputs were mixed, further the mixed waveform was passed through a buffer, this amplified mixed waveform is set to be the RIa output l.

When the inputs to the first ring interpolator RIa are selected as mentioned above, the RIa output a, which the output from the delay element D4 was passed through the buffers, is the most lead phase output in the RIa outputs. And the RIa output k, which the output from the delay element D6 was passed through the buffers, is the most lag phase output in the RIa outputs.

And at the interpolator ip310, the output from the delay element D6 is inputted to the buffer B310, which was designed so that the input signal having the lead phase was inputted in the two input signals, and the output from the delay element D4 is inputted to the buffer B130, which was designed so that the input signal having the lag phase was inputted in the two input signals.

As mentioned above, at the interpolator ip310, the output from the delay element D6 having the lag phase is inputted to the input for the lead phase, and the output from the delay element D4 having the lead phase is inputted to the input for the lag phase. And the phase difference between the outputs of the delay elements D6 and D4 is the time interval (2×dtc), therefore, under the condition mentioned above, the interpolator ip310 cannot generate an output having a middle phase between the two inputs in this fine time interval.

In order to solve this problem, when the first control circuit CONT1 received a delaying signal "up" that makes the RIa output that is selected by the second selection circuit S4 switch to the more lead phase output by the time interval dtc 1 being ½ of the time interval dtc, the first control circuit CONT1 switches the output of the delay element being the input to the first ring interpolator RIa. And also when the first control circuit CONT1 received an advancing signal "dn" that makes the RIa output that is selected by the second selection circuit S4 switch to the more lag phase output by the time interval dtc 1, the first control circuit CONT1 switches the output of the delay element being the input to the first ring interpolator RIa.

Next, the switching operation of the input and output of the first ring interpolator RIa is explained, at the time when the first control circuit CONT1 and the second control circuit CONT2 received the delaying signal "up" or the advancing signal "dn".

In case that the second control circuit CONT2 received the delaying signal "up" while the second selection circuit S4 was selecting the RIa output b, the second control circuit CONT2 controls the second selection circuit S4 so that the second selection circuit S4 switches the RIa output b to the RIa output a whose phase is lead by the dtc1 from the RIa output b.

When the first control circuit CONT1 received the delaying signal "up", that is, in case that the possibility that the second selection circuit S4 selects the RIa output whose phase is more lead than the RIa output a becomes higher than the possibility that the second selection circuit S4 selects the RIa output j or k, the first control circuit CONT1 controls the first selection circuit SL so that the first selection circuit SL switches one of the outputs from the delay elements selected by the first selection circuit SL to the output of another delay element. The output of the delay element to be switched is selected as follows.

The output of the delay element to be switched satisfies the following two conditions. First, as the output of the delay element to be switched, the output(s) of the delay element(s) being the base(s) of the RIa output, which is being selected by the second selection circuit S4 at the time of switching (at present), is excluded. And the output of the delay element, whose phase difference is the largest than the output(s) of the delay element(s) being the base(s) of the RIa output selecting at present, is selected as the output of the delay element to be switched. Second, the phase difference between the output of another delay element (to be selected) amplified at the first ring interpolator RIa (waveform mixing means) and the RIa output to be selected after switched is smaller than the phase difference between the output of the delay element (to be switched) amplified at the first ring interpolator RIa and the RIa output selecting at the time of switching (at present).

The RIa output b being selected at present is the output that the waveforms of the outputs from the delay elements D4 and D5 were mixed and the mixed waveform was passed through the buffer. And the output from the delay element D6 is selected as the output of the delay element to be switched. Because the output from the delay element D6 has larger phase difference from the output mixed the outputs from the delay elements D4 and D5 being the bases of the RIa output b at the time of switching.

Further, the phase difference between the RIa output that the output from the delay element D3 is amplified and the RIa output a that is selected after the switching is smaller than the phase difference between the RIa output that the output from the delay element D6 is amplified and the RIa output b that is selecting at the switching. And the possibility that the output from the delay element D3 rather than the output from the delay element D6 is used as the input to the RIa input In3 becomes high, at the time when the RIa output b was switched to the RIa output a.

In order that the outputs from three sequential delay elements are inputted to the RIa inputs In1 to In3, the output from the delay element D6, which was selected to be switched, is switched to the output from the delay element D3 whose phase is lead by the time interval (dtc×3) from the output from the delay element D6. As a result, the output from the delay element D4 is inputted to the RIa input In1, the output from the delay element D5 is inputted to the RIa input In2, and the output from the delay element D3 is inputted to the RIa input In3.

As mentioned above, by switching the RIa input, at the interpolator ip310, the output from the delay element D3, having lead phase in the delay elements D3 and D4, is inputted to the RIa input for the lead phase, and the output from the delay element D4, having lag phase, is inputted to the RIa input for the lag phase. With this, a middle phase between the RIa input In3 and the RIa input In1 can be obtained.

Since the RIa input In3 was switched to the output from the delay element D3, the RIa output l whose phase is lead by the time interval dtc1 from the RIa output a and the RIa output k whose phase is lead by the time interval dtc1 from the RIa output l can be obtained.

And it is assumed that the output from the delay element D4 is selected for the RIa input In1, the output from the delay element D5 is selected for the RIa input In2, and the output from the delay element D6 is selected for the RIa input In3. At this time, when the first control circuit CONT 1 received a delaying signal "up" switching from the RIa output c to the RIa output b, the outputs from the delay elements D4 and D6 are selected as the outputs having the larger phase difference from the output from the delay element D5 using at the time generating the RIa output at the switching. However, the both outputs from the delay elements D4 and D6 do not satisfy the second condition "the phase difference between the output of another delay element (to be selected) amplified at the first ring interpolator RIa (waveform mixing means) and the RIa output to be selected after switched is smaller than the phase difference between the output of the delay element (to be switched) amplified at the first ring interpolator RIa and the RIa output selecting at the time of switching (at presenty)." Therefore, switching the output from the delay element is not executed.

In case that the second control circuit CONT2 received the advancing signal "dn" while the second selection circuit S4 was selecting the RIa output j, the second control circuit CONT2 controls the second selection circuit S4 so that the second selection circuit S4 switches the RIa output j to the RIa output k whose phase is lag by the time interval dtc1 from the RIa output j.

When the first control circuit CONT1 received the advancing signal "dn", that is, the possibility, which the second selection circuit S4 selects the RIa output whose phase is more lag than the RIa output k rather than the RIa output a or b, becomes high, the first control circuit CONT1 controls the first selection circuit SL so that the first selection circuit SL switches one of the outputs of the delay elements being selected by the first selection circuit SL to the output from another delay element.

The output of the delay element to be switched satisfies the following two conditions. First, as the output of the delay element to be switched, the output(s) of the delay element(s) being the base(s) of the RIa output, which is being selected by the second selection circuit S4 at the time of switching (at present), is excluded. And the output of the delay element, whose phase difference is the largest than the output(s) of the delay element(s) being the base(s )of the RIa output selecting at present, is selected as the output of the delay element to be switched. Second, the phase difference between the output of another delay element (to be selected) amplified at the first ring interpolator RIa (waveform mixing means) and the RIa output to be selected after switched is smaller than the phase difference between the output of the delay element (to be switched) amplified at the first ring interpolator RIa and the RIa output selecting at the time of switching (at present).

The RIa output j being selected at present is the output that the waveforms of the outputs from the delay elements D5 and D6 were mixed and the mixed waveform was passed through the buffer. And the output from the delay element D4 is selected as the output of the delay element to be switched. Because the output from the delay element D4 has larger phase difference from the output mixed the outputs from the delay elements D5 and D6 being the bases of the RIa output j at the time of switching. And in case that the output of the delay element D4 is switched to the output of the delay element D7, when the RIa output j is switched to the RIa output k, the possibility to use the output of the delay element D7 becomes high.

Further, the phase difference between the RIa output that the output from the delay element D7 is amplified and the RIa output k that is selected after the switching is smaller than the phase difference between the RIa output that the output from the delay element D4 is amplified and the RIa output j that is selecting at the switching. And the possibility that the output from the delay element D7 rather than the output from the delay element D4 is used as the input to the RIa input In1 becomes high, at the time when the RIa output j was switched to the RIa output k.

In order that the outputs from three sequential delay elements are inputted to the RIa inputs In1 to In3, the output from the delay element D4, which was selected to be switched, is switched to the output from the delay element D7 whose phase is lag by the time interval (dtc×3) from the output from the delay element D4. As a result, the output from the delay element D7 is inputted to the RIa input In1, the output from the delay element D5 is inputted to the RIa input In2, and the output from the delay element D6 is inputted to the RIa input In3.

As mentioned above, by switching the RIa input, at the interpolator ip310, the output from the delay element D6, having lead phase in the delay elements D6 and D7, is inputted to the RIa input for the lead phase, and the output from the delay element D7, having lag phase, is inputted to the RIa input for the lag phase. With this, a middle phase between the RIa input In3 and the RIa input In1 can be obtained.

Since the RIa input In1 was switched to the output from the delay element D7, the RIa output l whose phase is lag by the time interval dtc1 from the RIa output k and the RIa output a whose phase is lag by the time interval dct1 from the RIa output l can be obtained.

And it is assumed that the output from the delay element D4 is selected for the RIa input In1, the output from the delay element D5 is selected for the RIa input In2, and the output from the delay element D6 is selected for the RIa input In3. At this time, when the first control circuit CONT 1 received an advancing signal "dn" switching from the RIa output c to the RIa output j, the outputs of the delay elements D4 and D6 are selected as the outputs having larger phase difference from the output from the delay element D5 using at the time generating the RIa output at the switching. However, the both outputs from the delay elements D4 and D6 do not satisfy the second condition "the phase difference between the output of another delay element (to be selected)

amplified at the first ring interpolator RIa (waveform mixing means) and the RIa output to be selected after switched is smaller than the phase difference between the output of the delay element (to be switched) amplified at the first ring interpolator RIa and the RIa output selecting at the time of switching (at present)." Therefore, switching the output from the delay element is not executed.

Generally, when the output of a digital circuit is switched at the time when its output state is "1", an unnecessary wedge shaped pulse called a glitch is generated. Therefore, it is necessary to adjust the switching timing so that the input of the digital circuit is switched at the state "0".

When the output from the delay element, which is composed of a digital circuit, is switched, in order to suppress the generation of glitches, it is necessary to adjust the switching timing. However, since the delay time at the first selection circuit SL, the second selection circuit S4, and the first ring interpolator RIa is large, it is difficult to control the switching timing of the output from the delay element. Consequently, when the RIa output is switched by the second selection circuit S4, the output of the delay element to be switched being the base of the RIa output is switched at the same time, there is a possibility that a glitch, generating at the time when the delay element is switched, is detected at the RIa output.

However, at the first embodiment of the present invention, it was designed that the output from the delay element being the base of the RIa output was not switched at the time of switching, when the RIa output is switched by the second selection circuit S4. Therefore, the glitch generating at the switching of the output of the delay element is not detected at the RIa output selected by the second selection circuit S4. Consequently, it is not necessary to consider the switching timing of the output from the delay element, and the timing designing at the two step variable length delay circuit becomes easy.

To the inputs to the interpolators ip120, ip230, and ip310, which are the bases of the RIa output selected by the second selection circuit S4 and the RIa output that has a high possibility to be selected later, an input signal having a lead phase is always inputted to the input for the lead phase, and an input signal having a lag phase is always inputted to the input for the lag phase. Therefore, the delay time change at switching the input is not generated, and it is possible to reduce jitters.

At the first embodiment of the present invention, the output of the coarse adjustment delay circuit GC was made to be 15 taps, but the number of the taps is not limited to 15, and an arbitrary number of taps can be used. Further, the output can be selected from an arbitrary tap instead of from the first tap. The number of selectors (5 way selector) in the first selection circuit SL was set to be 3, however, three or more selectors can be used.

FIG. 6 is a circuit diagram and a logic circuit diagram showing a second example of the interpolator shown in FIG. 4. In FIG. 6(a), the circuit diagram of the second example of the interpolator is shown, and in FIG. 6(b), the logic circuit diagram of the second example of the interpolator is shown.

Figure 7:
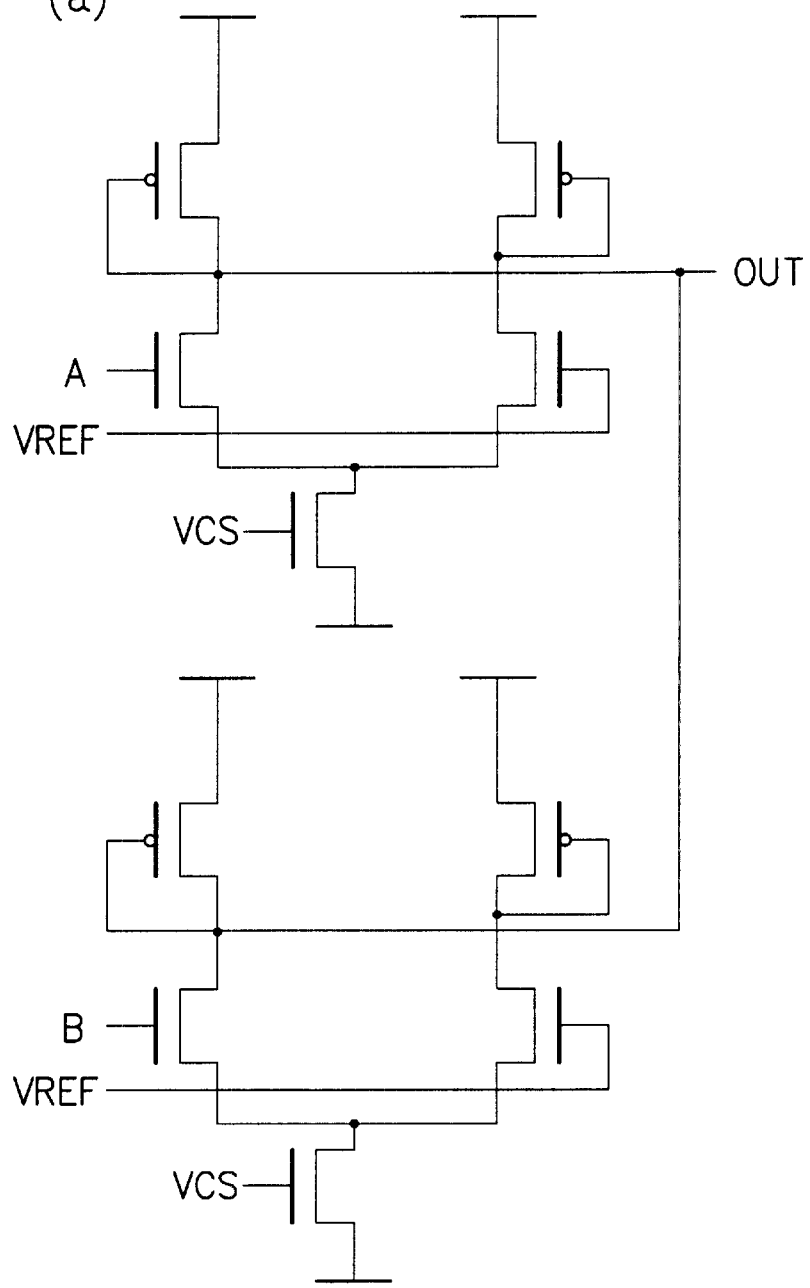
FIG. 7 is a circuit diagram and a logic circuit diagram showing a third example of the interpolator shown in FIG. 4.

FIG. 7 is a circuit diagram and a logic circuit diagram showing a third example of the interpolator shown in FIG. 4. In FIG. 7(a), the circuit diagram of the third example of the interpolator is shown, and in FIG. 7(b), the logic circuit diagram of the third example of the interpolator is shown.

FIG. 8 is a circuit diagram and a logic circuit diagram showing a fourth example of the interpolator shown in FIG. 4. In FIG. 8(a), the circuit diagram of the fourth example of the interpolator is shown, and in FIG. 8(b), the logic circuit diagram of the fourth example of the interpolator is shown.

At the first embodiment of the present invention, as shown in FIG. 5, each of the interpolators ip120, ip230, and ip310 was made of the combination of CMOS circuits. However, as shown in FIGS. 6, 7, and 8, the interpolators can be made of the combination of current mode logic (CML) circuits.

Further, at the first embodiment of the present invention, inverters are used as the buffers, however, amplifiers can be used as the buffers.

Next, referring to the drawings, a second embodiment of the two step variable length delay circuit of the present invention is explained.

Figure 9:
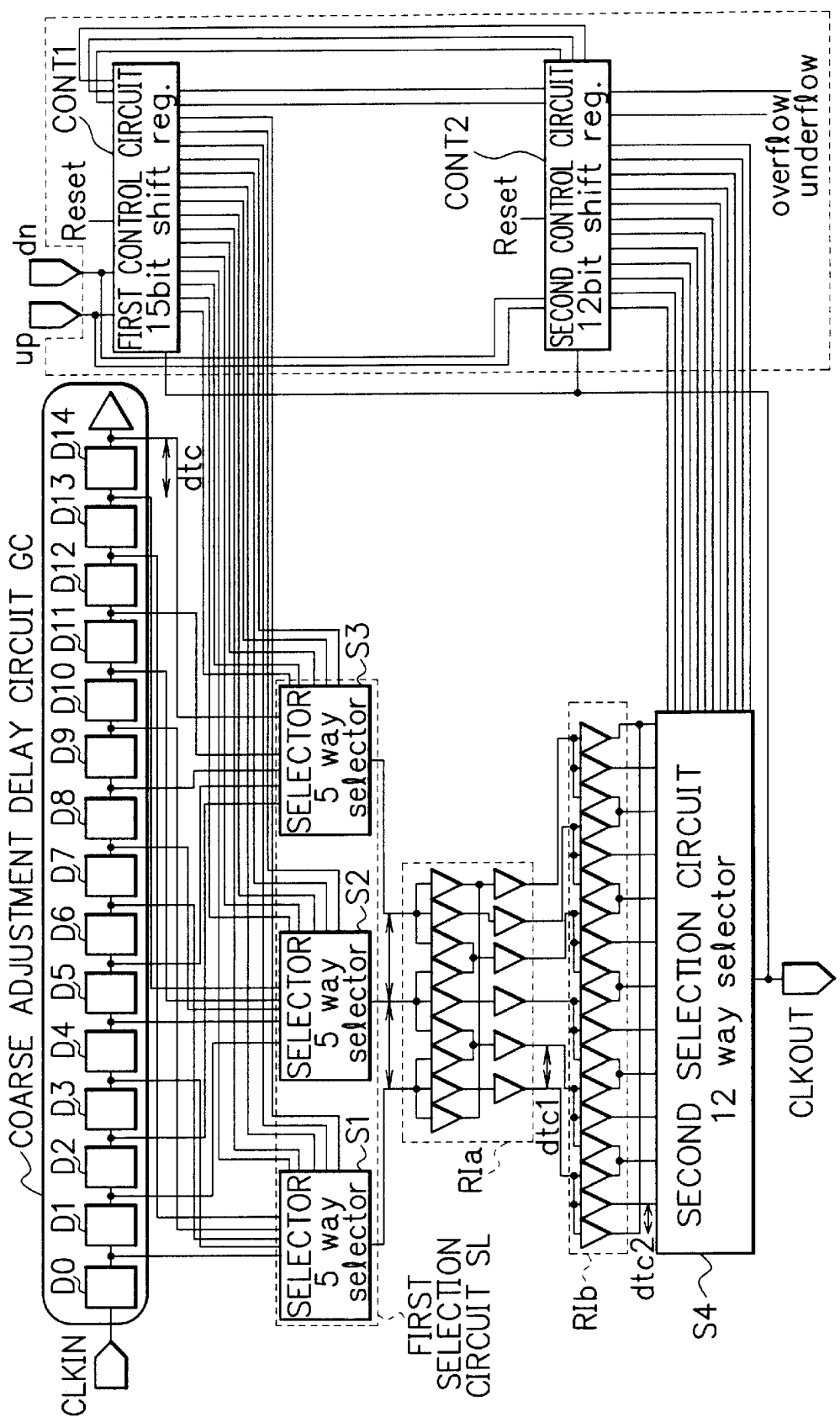
FIG. 9 is a block diagram showing a second embodiment of the two step variable length delay circuit of the present invention.

FIG. 9 is a block diagram showing the second embodiment of the two step variable length delay circuit of the present invention. Each function in the second embodiment has the same sign that the first embodiment has, when the function is almost equal to the function in the first embodiment.

Referring to FIG. 9, the structure and the function of each element at the second embodiment of the two step variable length delay circuit of the present invention are explained.

As shown in FIG. 9, the two step variable length delay circuit at the second embodiment of the present invention provides a coarse adjustment delay circuit GC being a delaying means, a first ring interpolator RIa being a wave mixing means, a first selection circuit SL, a second selection circuit S4, a first control circuit CONT1, a second control circuit CONT2, and a second ring interpolator RIb. The second ring interpolator RIb is positioned between the first ring interpolator RIa and the second selection circuit S4 and is connected to the first ring interpolator RIa and the second selection circuit S4 in series. In this, "r" pieces of the second ring interpolator RIb can be disposed, however, in FIG. 9, one piece of the second ring interpolator RIb is shown. And as shown in FIG. 9, at the second embodiment, the second ring interpolator RIb is newly added to the first embodiment.

As the same as at the first embodiment, the coarse adjustment delay circuit GC provides plural delay elements D0 to D14 composed of a digital circuit having delay time of a time interval dtc, and 15 taps being output terminals of the delay elements D0 to D14. And an input CLKIN is inputted to the coarse adjustment delay circuit GC.

The phase of the input CLKIN delays by the time interval dtc every time when the input CLKIN passes through one delay element. For example, the phase of the output of the delay element D5 delays by the time intervals (5×dtc) from the phase of the output of the delay element D0.

As the same as at the first embodiment, the first selection circuit SL provides a selector S1, a selector S2, and a selector S3, and each selector is a 5 way selector. Each output from the delay elements D0 to D14 is connected to each respective selector S1, S2, or S3 every three outputs. Each of the selectors S1 to S3 respectively selects the output from one delay element. For example, three outputs from the delay elements D3, D4, and D5 are selected sequentially by the selectors S1, S2, and S3.

The first ring interpolator RIa has the same structure that the first embodiment has, and makes the outputs having time interval dtc from the three selectors S1 to S3 input, and outputs signals having time interval dct1 being ½ of the dtc. Hereinafter, the inputs to the first ring interpolator RIa are referred to as RIa inputs, and the outputs from the first ring interpolator RIa are referred to as RIa outputs. Further, the outputs can be amplified again.

As the same as at the first embodiment, the first control circuit CONT1 sends a first selection signal, which makes the selectors S1 to S3 select the three sequential outputs from the delay elements D0 to D14 in the coarse adjustment delay circuit GC, to the selectors S1 to S3.

Figure 10:
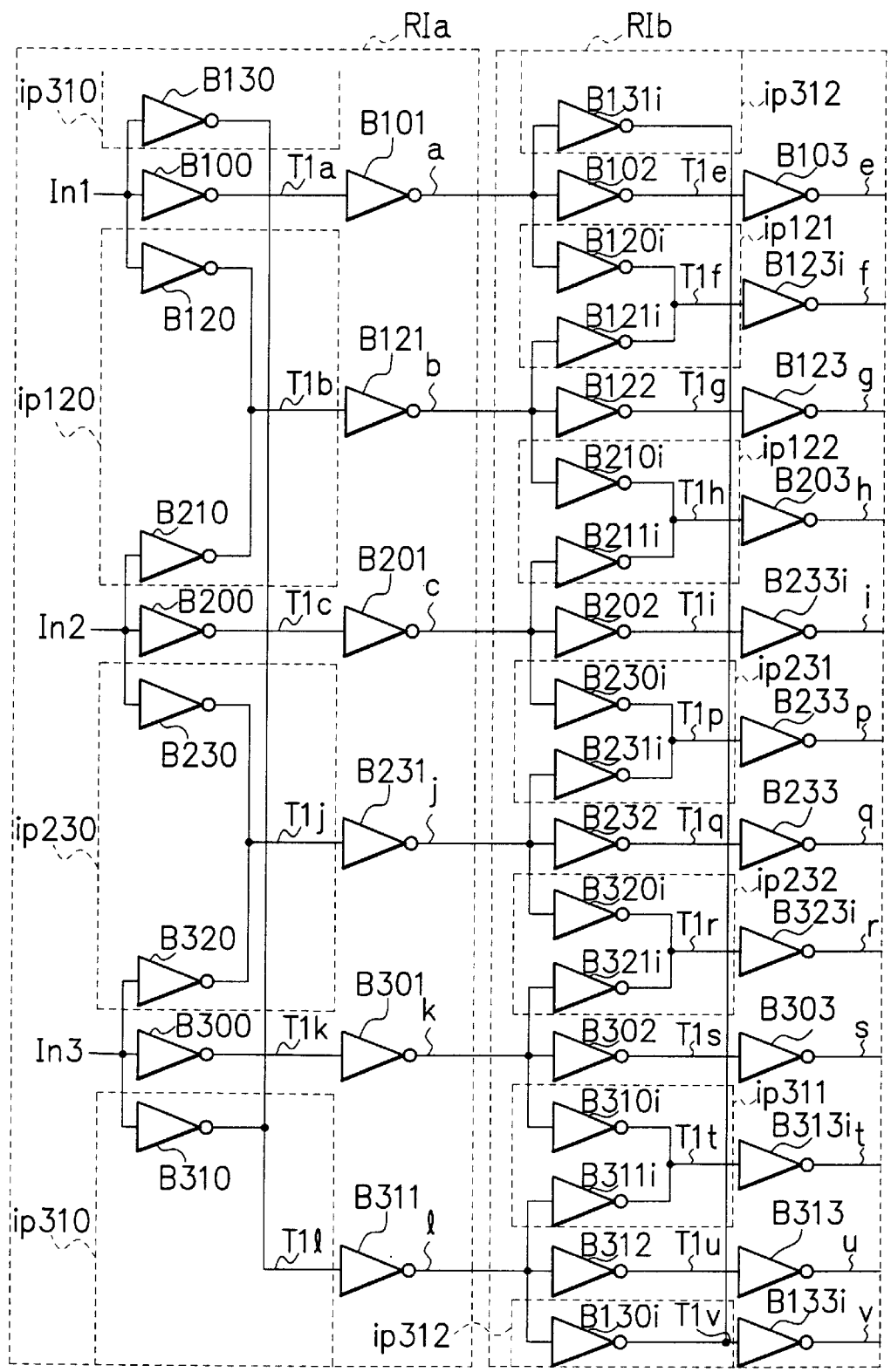
FIG. 10 is a circuit diagram showing the first ring interpolator and a second ring interpolator at the second embodiment of the two step variable length delay circuit of the present invention.

As mentioned above, at the second embodiment, the second ring interpolator RIb is disposed between the first ring interpolator RIa and the second selection circuit S4. FIG. 10 is a circuit diagram showing the first ring interpolator RIa and the second ring interpolator RIb at the second embodiment of the two step variable length delay circuit of the present invention. Referring to FIG. 10, the structure of the second ring interpolator RIb is explained.

At the second ring interpolator RIb, the outputs a, b, c, j, k, and l, which the outputs T1a, T1b, T1c, T1j, T1k, and T1l in the ring interpolator RIa are amplified, are made to be the RIb input Ina, Inb, Inc, Inj, Ink, and Inl. And the output amplified the RIb input Ina is made to be the RIb output T1e, the output amplified the RIb input Inb is made to be the RIb output T1g, the output amplified the RIb input Inc is made to be the RIb output T1i, the output amplified the RIb input Inj is made to be the RIb output T1q, the output amplified the RIb input Ink is made to be the RIb output T1s, and the output amplified the RIb input Inl is made to be the RIb output T1u. And the output mixed the waveforms of the RIb inputs a and b is made to the RIb output T1f, the output mixed the waveforms of the RIb inputs b and c is made to the RIb output T1h, the output mixed the waveforms of the RIb inputs c and j is made to the RIb output T1p, the output mixed the waveforms of the RIb inputs j and k is made to the RIb output T1r, the output mixed the waveforms of the RIb inputs k and l is made to the RIb output T1t, the output mixed the waveforms of the RIb inputs l and a is made to the RIb output T1v. Further, the RIb outputs T1e, T1f, T1g, T1h, T1i, T1p, T1q, T1r, T1s, T1t, T1u, and T1v are amplified and the amplified outputs can be made to be the RIb outputs e, f, g, h, i, p, q, r, s, t, u, v.

As shown in FIG. 10, the second ring interpolator RIb provides buffers B102, B122, B202, B232, B302, and B312, and interpolators ip121, ip122, ip231, ip232, ip311, and ip312.

A signal inputted to the RIb input Ina is amplified at the buffer B102 and outputted from the output T1e, a signal inputted to the RIb input Inb is amplified at the buffer B122 and outputted from the output T1g, a signal inputted to the RIb input Inc is amplified at the buffer B202 and outputted from the output T1i, a signal inputted to the RIb input Inj is amplified at the buffer B232 and outputted from the output T1q, a signal inputted to the RIb input Ink is amplified at the buffer B302 and outputted from the output T1s, and a signal inputted to the RIb input Inl is amplified at the buffer B312 and outputted from the output T1u.

The interpolator ip121 provides buffers B120i and B121i, and outputs the T1f by mixing the waveforms of the outputs from the buffers B120i and B121i. And a signal having a lead phase is inputted to the buffer B120i, and a signal having a lag phase is inputted to the buffer B121i.

The interpolator ip122 provides buffers B210i and B211i, and outputs the T1h by mixing the waveforms of the outputs from the buffers B210i and B211i. And a signal having a lead phase is inputted to the buffer B210i, and a signal having a lag phase is inputted to the buffer B211i.

The interpolator ip231 provides buffers B230i and B231i, and outputs the T1p by mixing the waveforms of the outputs from the buffers B230i and B231i. And a signal having a lead phase is inputted to the buffer B230i, and a signal having a lag phase is inputted to the buffer B231i.

The interpolator ip232 provides buffers B320i and B321i, and outputs the T1r by mixing the waveforms of the outputs from the buffers B320i and B321i. And a signal having a lead phase is inputted to the buffer B320i, and a signal having a lag phase is inputted to the buffer B321i.

The interpolator ip311 provides buffers B310i and B311i, and outputs the T1t by mixing the waveforms of the outputs from the buffers B310i and B311i. And a signal having a lead phase is inputted to the buffer B310i, and a signal having a lag phase is inputted to the buffer B311i.

The interpolator ip312 provides buffers B130i and B131i, and outputs the T1v by mixing the waveforms of the outputs from the buffers B130i and B131i. And a signal having a lead phase is inputted to the buffer B130i, and a signal having a lag phase is inputted to the buffer B131i.

The second selection circuit S4 selects one of the outputs T1e, T1f, T1g, T1h, T1i, T1p, T1q, T1r, T1s, T1t, T1u, and T1v, or one of the RIb outputs e, f, g, h, i, p, q, r, s, t, u, and v, which the outputs T1e to T1v are amplified at buffers.

The second control circuit CONT2 controls the second selection circuit S4 by sending a third selection signal, which makes the second selection circuit S4 select one of the RIb outputs from the second ring interpolator RIb.

Next, referring to FIGS. 9 and 10, the operation of the second embodiment of the present invention is explained.

The phase of the input CLKIN delays by the time interval dtc, every time when the input CLKIN passes through one of the delay elements in the coarse adjustment delay circuit GC. Therefore, as the same as at the first embodiment, the coarse adjustment delay circuit GC obtains the output from the delay element D0, whose phase is delayed by the time interval dtc from the phase of the input CLKIN. Further, the coarse adjustment delay circuit GC obtains the outputs from the delay elements D1 to D14, whose phases are delayed by the time interval dtc from the output from the previous delay element.

As the same as at the first embodiment, the first selection circuit SL provides three selectors S1 to S3. The selector S1 selects one output from the outputs of the delay elements D0, D3, D6, D9, and D12, by receiving the first selection signal from the first control circuit CONT1. The selector S2 selects one output from the outputs of the delay elements D1, D4, D7, D10, and D13, by receiving the first selection signal from the first control circuit CONT1. The selector S3 selects one output from the outputs of the delay elements D2, D5, D8, D11, and D14, by receiving the first selection signal from the first control circuit CONT1. At this time, the selectors S1 to S3 selects the three sequential outputs from the delay elements D0 to D14 by receiving the first selection signal from the first control circuit CONT1.

The first ring interpolator RIa has the same structure that the first embodiment has, and makes the outputs from the three delay elements selected by the selectors S1 to S3 RIa input the inputs In1 to In3. And the first ring interpolator Ria outputs the RIa output T1a, which the RIa input In1 was amplified, and the RIa output T1c, which the RIa input In2 was amplified, and the RIa output T1k, which the RIa input In3 was amplified. The outputs a, c, and k, which the RIa outputs T1a, T1c, and T1k were amplified, can be used as the outputs.

And also, the first ring interpolator RIa outputs the RIa output T1b, which the waveforms of the RIa inputs in1 and In2 were mixed at the interpolator ip120, the RIa output T1j, which the waveforms of the RIa inputs In2 and In3 were mixed at the interpolator ip230, the RIa output T1l, which the waveforms of the RIa inputs In3 and In1 were mixed at the interpolator ip310. The outputs b, j, and l, which the RIa outputs T1b, T1j, and T1l were amplified, can be used as the outputs.

The second ring interpolator RIb, to which the RIa outputs whose phase difference is the time interval dct1 are inputted, and outputs signals whose phase difference is the time interval dtc2 being ½ of the time interval dct1.

The second selection circuit S4 selects one of the RIb outputs T1e, T1f, T1g, T1h, T1i, T1p, T1q, T1r, T1s, T1t, T1u, and T1v, corresponding to the third selection signal from the second control circuit CONT2. Or the second selection circuit S4 selects one of the RIb outputs e, f, g, h, i, p, q, r, s, t, u, and v, which the RIb outputs T1e, T1f, T1g, T1h, T1i, T1p, T1q, T1r, T1s, T1t, T1u, and T1v were amplified.

As mentioned above, the second control circuit CONT2 controls the second selection circuit S4, by sending the third selection signal, which makes the second selection circuit S4 select one of the RIb outputs from the second ring interpolator RIb.

In case that the selectors S1 to S3 select the most lead phase signal for the RIa input In1 and the most lag phase signal for the RIa input In3, at the second ring interpolator RIb, the T1e output that the signal inputted to the RIb input Ina has the most lead phase, and the T1s output that the signal inputted to the RIb input Ink has the most lag phase.

At this time, the RIa input In1 and the RIa input In3 are separated by 2 output taps of the coarse adjustment delay circuit GC, and at the interpolator ip310, the input signal having the lead phase is inputted to the RIa input In3, and the input signal having the lag phase is inputted to the RIa input In1. That is, the input signals are inputted in reverse at the interpolator ip310, compared with the case of the interpolator ip120. Therefore, the interpolator ip310 cannot obtain an output having a fine time interval and having a middle phase between the RIa input In3 and the RIa input In1. Consequently, at the second ring interpolator RIb, the RIb outputs T1t, T1u, T1v cannot obtain outputs having a fine time interval.

For example, a case is studied. The case is that the first selection circuit SL selects the outputs from the delay elements D4, D5, and D6, as the inputs to the first ring interpolator RIa, and the output from the delay element D4 is selected to the input to the RIa input In1, the output from the delay element D5 is selected to the input to the RIa input In2, and the output from the delay element D6 is selected to the input to the RIa input In3.

At the case that the inputs to the first ring interpolator RIa are selected as mentioned above, the outputs a, b, c, j, k, and l from the first ring interpolator RIa are set as follows. The RIa output a is set to be the output that the output from the delay element D4 was amplified twice. The output from the delay element D4, passed through one buffer, and the output from the delay element D5, passed through the other buffer, were connected and waveforms of these two outputs were mixed, further the mixed waveform was passed through a buffer, this amplified mixed waveform is set to be the RIa output b. The RIa output c is set to be the output that the output from the delay element D5 was amplified twice. The output from the delay element D5, passed through one buffer, and the output from the delay element D6, passed through the other buffer, were connected and waveforms of these two outputs were mixed, further the mixed waveform was passed through a buffer, this amplified mixed waveform is set to be the RIa output j. The RIa output k is set to be the output that the output from the delay element D6 was amplified twice. The output from the delay element D6, passed through one buffer, and the output from the delay element D4, passed through the other buffer, were connected and waveforms of these two outputs were mixed, further the mixed waveform was passed through a buffer, this amplified mixed waveform is set to be the RIa output l.

When the inputs to the first ring interpolator RIa are selected as mentioned above, the RIa output a, which the output from the delay element D4 was amplified, is the most lead phase output in the RIa outputs. And the RIa output k, which the output from the delay element D6 was amplified, is the most lag phase output in the RIa outputs.

And at the interpolator ip310, the output from the delay element D6 is inputted to the buffer B310, which was designed so that the input signal having the lead phase was inputted in the two input signals, and the output from the delay element D4 is inputted to the buffer B130, which was designed so that the input signal having the lag phase was inputted in the two input signals.

As mentioned above, at the interpolator ip310, the output from the delay element D6 having the lag phase is inputted to the buffer 310 designed for the lead phase in the two input signals, and the output from the delay element D4 having the lead phase is inputted to the buffer B130 designed for the lag phase. And the phase difference between the outputs of the delay elements D6 and D4 is the time interval (2×dtc), therefore, under the condition mentioned above, the interpolator ip310 cannot generate an output having a fine time interval and having a middle phase from the two inputs.

Consequently, at the interpolators ip311 and ip312 in the second ring interpolator RIb, an output having a middle phase between the two input signals cannot be generated in a fine time interval, based on the two input signals. And also, a signal having (2×dtc2) time interval lag phase from the RIb output T1s cannot be obtained from the RIb output T1u.

When the first control circuit CONT1 received a delaying signal "up" that makes the RIb output that is selected by the second selection circuit S4 switch to the more lead phase output by the time interval dtc2 being ½ of the time interval dct1, the first control circuit CONT1 switches the output of the delay element being the input to the first ring interpolator RIa. And also when the first control circuit CONT1 received an advancing signal "dn" that makes the RIb output that is selected by the second selection circuit S4 switch to the more lag phase output by the time interval dtc2, the first control circuit CONT1 switches the output of the delay element being the input to the first ring interpolator RIa.

Next, the switching operation of the input and output of the first ring interpolator RIa and the second ring interpolator RIb is explained, at the time when the first control circuit CONT1 and the second control circuit CONT2 received the delaying signal "up" or the advancing signal "dn".

In case that the second control circuit CONT2 received the delaying signal "up" while the second selection circuit S4 was selecting the RIb output g, the second control circuit CONT2 controls the second selection circuit S4 so that the second selection circuit S4 switches the RIb output g to the RIb output f whose phase is lead by the dtc2 from the RIb output g.

When the first control circuit CONT1 received the delaying signal "up", that is, in case that the possibility that the second selection circuit S4 selects a more lead phase output than the RIb output e becomes higher than the possibility that the second selection circuit S4 selects the RIb output p, q, r, or s, the first control circuit CONT1 controls the first selection circuit SL so that the first selection circuit SL switches one of the outputs from the delay elements selected by the first selection circuit SL to the output of another delay element. The output of the delay element to be switched is selected as follows.

The output of the delay element to be switched satisfies the following two conditions. First, as the output of the delay element to be switched, the outputs of the delay elements being the basis of the RIb outputs, which are being selected by the second selection circuit S4 at present, are excluded. And the output of the delay element, whose phase difference is larger than the outputs of the delay elements being the basis of the RIb outputs selecting at present, is selected as the output of the delay element to be switched. Second, the phase difference between the output of another delay element (to be selected) amplified at the second ring interpolator RIb (waveform mixing means) and the RIb output to be selected after switched is smaller than the phase difference between the output of the delay element (to be switched) amplified at the second ring interpolator RIb and the RIb output selecting at the time of switching (at present).

The RIb output g being selected at present is the output that the waveforms of the outputs from the delay elements D4 and D5 were mixed and the mixed waveform was passed through the buffers. And the output from the delay element D6 is selected as the output of the delay element to be switched. Because the output from the delay element D6 has larger phase difference from the output mixed the outputs from the delay elements D4 and D5 being the bases of the RIb output g at the time of switching.

Further, the phase difference between the RIb output that the output from the delay element D3 was amplified and the RIb output f that is selected after the switching is smaller than the phase difference between the RIb output that the output from the delay element D6 was amplified and the RIb output g that is selecting at the switching. And the possibility that the output v being more lead phase than the output e is used is high at the time when the RIb output g was switched to the RIb output f, as the output v has more lead phase than the output e. That is, the possibility, which the output from the delay element D3 rather than the output from the delay element D6 is used as the RIa input 3, becomes high.

In order that the outputs from three sequential delay elements are inputted to the RIa inputs In1 to In3, the output from the delay element D6, which was selected to be switched, is switched to the output from the delay element D3 whose phase is lead by the time interval (dtcx3) from the output from the delay element D6. As a result, the output from the delay element D4 is inputted to the RIa input In1, the output from the delay element D5 is inputted to the RIa input In2, and the output from the delay element D3 is inputted to the RIa input In3.

As mentioned above, by switching the RIa input, at the interpolator ip310, the output from the delay element D3, having lead phase in the delay elements D3 and D4, is inputted to the RIa input for the lead phase, and the output from the delay element D4, having lag phase, is inputted to the RIa input for the lag phase. With this, a middle phase between the RIa input In3 and the RIa input In1 can be obtained.

Since the RIa input In3 was switched to the output from the delay element D3, the RIa output l whose phase is lead by the time interval dct1 from the RIa output a and the RIa output k whose phase is lead by the time interval dct1 from the RIa output l can be obtained.

Therefore, the RIb output v whose phase is lead by the time interval dtc2 from the RIb output e, and the RIb output u whose phase is lead by the time interval dtc2 from the RIb output v, can be obtained. And also, the RIb output t whose phase is lead by the time interval dtc2 from the RIb output u, and the RIb output s whose phase is lead by the time interval dtc2 from the RIb output t, can be obtained.

And it is assumed that the output from the delay element D4 is selected for the RIa input In1, the output from the delay element D5 is selected for the RIa input In2, and the output from the delay element D6 is selected for the RIa input In3. At this time, when the first control circuit CONT 1 received a delaying signal "up" switching from the RIb output i to the RIb output h, the outputs of the delay elements D4 and D6 are selected as the outputs having the largest phase difference from the output from the delay element D5 using at the time generating the RIa output at the switching. However, the both outputs from the delay elements D4 and D6 do not satisfy the second condition "the phase difference between the output of another delay element (to be selected) amplified at the second ring interpolator RIb (waveform mixing means) and the RIb output to be selected after switched is smaller than the phase difference between the output of the delay element (to be switched) amplified at the second ring interpolator RIb and the RIb output selecting at the time of switching (at present)." Therefore, switching the output from the delay element is not executed.

In case that the second control circuit CONT2 received the advancing signal "dn" while the second selection circuit S4 was selecting the RIb output q, the second control circuit CONT2 controls the second selection circuit S4 so that the second selection circuit S4 switches the RIb output q to the RIb output r whose phase is lag by the time interval dtc2 from the RIb output q.

When the first control circuit CONT1 received the advancing signal "dn", that is, the possibility, which the second selection circuit S4 selects an output whose phase is lag from the RIb output s rather than the RIb output e, f, g, or h, becomes high, the first control circuit CONT1 controls the first selection circuit SL so that the first selection circuit SL switches one of the outputs of the delay elements being selected by the first selection circuit SL to the output from another delay element.

The output of the delay element to be switched satisfies the following two conditions. First, as the output of the delay element to be switched, the outputs of the delay elements being the basis of the RIb outputs, which are being selected by the second selection circuit S4 at present, are excluded. And the output of the delay element, whose phase difference is larger than the outputs of the delay elements being the basis of the RIb outputs selecting at present, is selected as the output of the delay element to be switched. Second, the phase difference between the output of another delay element (to be selected) amplified at the second ring interpolator RIb (waveform mixing means) and the RIb output to be selected after switched is smaller than the phase difference between the output of the delay element (to be switched) amplified at the second ring interpolator RIb and the RIb output selecting at the time of switching (at present).

The RIb output q being selected at present is the output that the waveforms of the outputs from the delay elements D5 and D6 were mixed and the mixed waveform was passed through the buffers. And the output from the delay element D4 is selected as the output of the delay element to be switched. Because the output from the delay element D4 has larger phase difference from the output mixed the outputs from the delay elements D5 and D6 being the bases of the RIb output q at the time of switching. When the output q changes to the output r, as the output e, the possibility that an output having more lag phase than the output s is used becomes high. That is, the possibility, which that the output from the delay element D7 rather than from the delay element D4 is used, becomes high.

Further, the phase difference between the RIb output that the output from the delay element D7 was amplified and the RIb output r that is selected after the switching is smaller than the phase difference between the RIb output that the output from the delay element D4 was amplified and the RIb output q that is selecting at the switching. And the possibility that the output t being more lag phase than the output s is used is high as that the output e has a more lag phase than the output s, at the time when the RIb output q was switched to the RIb output r. That is, the possibility, which the output from the delay element D7 rather than from the delay element D4 is used as the RIa input In1, becomes high.

In order that the outputs from three sequential delay elements are inputted to the RIa inputs In1 to In3, the output from the delay element D4, which was selected to be switched, is switched to the output from the delay element D7 whose phase is lag by the time interval (dtc×3) from the output from the delay element D4. As a result, the output from the delay element D7 is inputted to the RIa input In1, the output from the delay element D5 is inputted to the RIa input In2, and the output from the delay element D6 is inputted to the RIa input In3.

As mentioned above, by switching the RIa input, at the interpolator ip310, the output from the delay element D6, having lead phase in the delay elements D6 and D7, is inputted to the RIa input for the lead phase, and the output from the delay element D7, having lag phase, is inputted to the RIa input for the lag phase. With this, a middle phase between the RIa input In3 and the RIa input In1 can be obtained.

Since the RIa input In1 was switched to the output from the delay element D7, the RIa output l whose phase is lag by the time interval dct1 from the RIa output k and the RIa output a whose phase is lag by the time interval dct1 from the RIa output l can be obtained.

Therefore, the RIb output t whose phase is lag by the time interval dtc2 from the RIb output s, and the RIb output u whose phase is lag by the time interval dtc2 from the RIb output t, can be obtained. And also, the RIb output v whose phase is lag by the time interval dtc2 from the RIb output u, and the RIb output e whose phase is lag by the time interval dtc2 from the RIb output v, can be obtained.

And it is assumed that the output from the delay element D4 is selected for the RIa input In1, the output from the delay element D5 is selected for the RIa input In2, and the output from the delay element D6 is selected for the RIa input In3. At this time, when the first control circuit CONT 1 received an advancing signal "dn" switching from the RIb output i to the RIb output p, the outputs of the delay elements D4 and D6 are selected as the outputs having the largest phase difference from the output from the delay element D5 using at the time generating the RIa output at the switching. However, the both outputs from the delay elements D4 and D6 do not satisfy the second condition "the phase difference between the output of another delay element (to be selected) amplified at the second ring interpolator RIb (waveform mixing means) and the RIb output to be selected after switched is smaller than the phase difference between the output of the delay element (to be switched) amplified at the second ring interpolator RIb and the RIb output selecting at the time of switching (at present)." Therefore, switching the output from the delay element is not executed.

Generally, when the output of a digital circuit is switched at the time when its output state is "1", an unnecessary wedge shaped pulse called a glitch is generated. Therefore, it is necessary to adjust the switching timing so that the input of the digital circuit is switched at the state "0".

When the output from the delay element, which is composed of a digital circuit, is switched, in order to suppress the generation of glitches, it is necessary to adjust the switching timing. However, since the delay time at the first selection circuit SL, the second selection circuit S4, and the first ring interpolator RIa is large, it is difficult to control the switching timing of the output from the delay element. Consequently, when the RIa outputs are switched by the second selection circuit S4, the output of the delay element to be switched being the base of the RIa output is switched at the same time, there is a possibility that a glitch, generating at the time when the delay element is switched, is detected at the RIa output.

At the second embodiment of the present invention, it was designed that the output from the delay element being the base of the RIa output was not switched at the switching, at the time when the RIa output is switched by the second selection circuit S4. Therefore, the glitch generating at the switching of the output of the delay element is not detected at the RIa output selected by the second selection circuit S4. Consequently, it is not necessary to consider the switching timing of the output from the delay element, and the timing designing at the two step variable length delay circuit becomes easy.

To the inputs to the interpolators ip120, ip230, and ip310, which become the bases of the RIa output selected by the second selection circuit S4 and the RIa output that has a high possibility to be selected later, an input signal having a lead phase is always inputted to the input for the lead phase, and an input signal having a lag phase is always inputted to the input for the lag phase. Therefore, the delay time change at switching the input is not generated, and it is possible to reduce jitters.

At the second embodiment of the present invention, the output of the coarse adjustment delay circuit GC was made to be 15 taps, but the number of the taps is not limited to 15, and an arbitrary number of taps can be used. Further, the output can be selected from an arbitrary tap instead of from the first tap. The number of selectors (5 way selector) in the first selection circuit SL was set to be 3, however, three or more selectors can be used.

At the second embodiment, inverters are used as the buffers, however, amplifiers can be used as the buffers.

And at the second embodiment, as the same as the first embodiment, the interpolators ip120, ip230, and ip310 mix the waveforms of the two inputs, whose phases are different each other, and generate an output whose phase is middle between the two inputs.

At the two step variable length delay circuit at the second embodiment, an output selected by the second selection circuit S4 by the control of the second control circuit CONT2 is an output from the second ring interpolator RIb, or an output, which the output from the second ring interpolator RIb was amplified. That is, compared with the first embodiment, the time interval is made to be finer at the second embodiment.

As mentioned above, at the second embodiment, the time interval between the taps of the coarse adjustment delay circuit GC is made to be finer than that at the first embodiment, therefore, the delay time can be adjusted more finely.

At the second embodiment, the second ring interpolator RIb is disposed between the output of the first ring interpolator RIa and the input of the second selection circuit S4. However, as the second ring interpolator RIb, r pieces of the ring interpolators can be disposed in series.

In case that the r pieces of the ring interpolators are disposed, it is assumed that the output of the first ring interpolator RIa is a previous stage, and the input of the second selection circuit S4 is a next stage. The input of the ring interpolator positioned first in the r pieces of ring interpolators is connected to the output of the first ring interpolator RIa being disposed as the previous stage. The second selection circuit S4 selects one of the outputs from the ring interpolator positioned last in the r pieces ring interpolators, and the second control circuit CONT2 controls the second selection circuit S4.

Each of the r pieces of ring interpolators has the same structure that the other ring interpolators in the embodiments of the present invention have, and operates as the same as the other ring interpolators.

Next, an operation of an sth ring interpolator counted from the first of the r pieces of ring interpolators from the previous stage is explained. In this, the s is an integer being 1 or more and r or less.

It is assumed that the outputs of m pieces of delay elements selected by the first selection circuit SL are the first input to the mth input to the first ring interpolator RIa in phase lead order. At this time, the outputs from the first output to the $(m \times 2^s)$th output of the $(s-1)$th ring interpolator (the previous ring interpolator) are inputted to the first input to the $(m \times 2^s)$th input of the sth ring interpolator. The sth ring interpolator provides buffers, $(m \times 2^s - 1)$ pieces of interpolators ipy (y is an integer being 1 or more and $(m \times 2^s - 1)$ or less), and the $(m \times 2^s)$th interpolators ip. The buffers buffer respective the first input to the $(m \times 2^s)$th input. The $(m \times 2^s - 1)$ pieces of interpolators ipy, to which the first input to the $(m \times 2^s - 1)$th input are inputted, mix the waveforms of the tth input (t is an integer being 1 or more and $(m \times 2^s - 1)$ or less) and the $(t+1)$th input and obtain respective middle phase outputs and make these outputs the 2tth output. The $(m \times 2^s)$th interpolator ip, to which the $(m \times 2^s)$th input is inputted for the phase lead input and the first input is inputted for the phase lag input, mixes the waveforms of the inputs and outputs the $(m \times 2^{s+1})$th output as the middle phase output.

It is assumed that the time interval between the nth input (n is an integer being 1 or more and (m−1) or less), which is one of the outputs from the m pieces of delay elements selected by the first selection circuit SL, and the $(n+1)$th input is (dtc). At this time, the phase difference between the tth input and the $(t+1)$th input is the time interval $(dtc/2^s)$, in the range from the t is 1 to $(2^s \times (m-1)+1)$. And when the phase of the mth input, which is one of the outputs from the m pieces of delay elements selected by the first selection circuit SL, becomes lead from the phase of the first input, the phase difference between the tth input and the $(t+1)$th input is the time difference $(dtc/2^s)$, in the range that the t is $(2^s \times (m-1)+1)$ to $(m \times 2^s)$.

It is assumed that the time interval between the nth input (n is an integer being 1 or more and (m−1) or less), which is one of the outputs from the m pieces of delay elements selected by the first selection circuit SL, and the $(n+1)$th input is (dtc). At this time, the phase difference between the uth output and the $(u+1)$th output is the time interval $(dtc/2^{s+1})$, in the range from the u is 1 to $(2^{s+1} \times (m-1)+1)$. And when the phase of the mth input, which is one of the outputs from the m pieces of delay elements selected by the first selection circuit SL, becomes lead from the phase of the first input, the phase difference between the uth output and the $(u+1)$th output is the time difference $(dtc/2^{s+1})$, in the range that the u is $(2^{s+1} \times (m-1)+1)$ to $(m \times 2^{s+1})$. Therefore, an output having a finer adjustment interval than the time difference $(dtc/2^s)$ can be obtained.

When the second control circuit CONT2 received a delaying signal "up", the second control circuit CONT2 controls the second selection circuit S4 so that the second selection circuit S4 switches the output of the last ring interpolator in the r pieces of ring interpolators to the output whose phase is lead by the time interval $(dtc/2^{s+1})$. When the second control circuit CONT2 received an advancing signal "dn", the second control circuit CONT2 controls the second selection circuit S4 so that the second selection circuit S4 switches the output of the last ring interpolator in the r pieces of ring interpolators to the output whose phase is lag by the time interval $(dtc/2^{s+1})$.

When the second control circuit CONT2 received a delaying signal "up", while the first output of the last ring interpolator in the r pieces of ring interpolators was being selected, the second control circuit CONT2 controls the second selection circuit S4 so that the second selection circuit S4 switches the first output of the last ring interpolator to the output of the $(m \times 2^{s+1})$th output of the last ring interpolator. When the second control circuit CONT2 received an advancing signal "dn", while the $(m \times 2^{s+1})$th output of the last ring interpolator in the r pieces of ring interpolators was being selected, the second control circuit CONT2 controls the second selection circuit S4 so that the second selection circuit S4 switches the $(m \times 2^{s+1})$th output of the last ring interpolator to the first output of the last ring interpolator.

When the first control circuit CONT1 received a delaying signal "up", the first control circuit CONT1 makes the output from the delay element, which is not using at the time when the output from the last ring interpolator is generated, be the output from the delay element to he switched. And the first control circuit CONT1 controls the first selection circuit SL so that the first selection circuit SL selects the outputs from m pieces sequential delay elements, by switching to the output of the delay element whose phase is lead by the time interval $(m \times dtc)$ from the output of the delay element to be switched. And also, the output of the delay element to be switched at this time is the output of the delay element whose phase difference is the largest in the outputs of the delay elements, which are used at the time when the output of the last ring interpolator selecting after switching is generated, and a coarse adjustment delay signal whose using probability is smaller than the other coarse adjustment delay signals are selected.

When the first control circuit CONT1 received an advancing signal "dn", the first control circuit CONT1 makes the output from the delay element, which is not using at the time when the output from the last ring interpolator is generated, be the output from the delay element to be switched. And the first control circuit CONT1 controls the first selection circuit SL so that the first selection circuit SL selects the outputs from m pieces sequential delay elements, by switching to the output of the delay element whose phase is lag by the time interval $(m \times dtc)$ from the output of the delay element to be switched. And also, the output of the delay element to be switched at this time is the output of the delay element whose phase difference is the largest in the outputs of the delay elements, which are used at the time when the output of the last ring interpolator selecting after switching is generated, and a coarse adjustment delay signal whose using probability is smaller than the other coarse adjustment delay signals are selected.

At the second embodiment of the present invention, the output of the coarse adjustment delay circuit GC was made to be 15 taps, but the number of the taps is not limited to 15, and an arbitrary number of taps can be used. Further, the output can be selected from an arbitrary tap instead of from the first tap. The number of selectors (5 way selector) in the first selection circuit SL was set to be 3, however, three or more selectors can be used.

At the second embodiment of the present invention, as the same as the first embodiment, the interpolators ip120, ip121, ip122, ip230, ip231, ip232, ip310, ip311, ip312, ipy, and ip(m×2$^s$) can be made of the combination of CMOS circuits shown in FIG. 5, and also can be made of the combination of CML circuits shown in FIGS. 6, 7, and 8.

At the second embodiment of the present invention, as the same as the first embodiment, the sizes (on resistance values) of the transistors in the interpolators ip120, ip121, ip122, ip230, ip231, ip232, ip310, ip311, ip312, ipy, and ip(m×2$^s$) are adjusted so than the interpolators can generate a signal having a middle phase between inputted two signals.

At the second embodiment, inverters are used as the buffers, however, amplifiers can be used as the buffers.

As mentioned above, according to the present invention, in a two step variable length delay circuit, a coarse adjustment delay circuit (gate chain) provides delay elements composed of a digital circuit, which is easy for designing compared with an analog circuit that is difficult in the designing, in order to make the delay time variable. Therefore, the designing of the two step variable length delay circuit becomes easy.

And also the two step variable length delay circuit of the present invention provides inverters for amplifying input signals, and interpolators (phase mixing circuit) that mixes waveforms of two outputs, which adjacent two inputs are amplified at buffers, by connecting the two outputs and generates a middle phase between the adjacent two inputs. Further, plural ring interpolators, composed of buffers and interpolators, can be provided in the two step variable length delay circuit, therefore, finer phase signals can be obtained in the wide adjustment range.

When the output from the delay element is switched, in order to suppress the generation of glitches, it is necessary to adjust the switching timing. However, at the two step variable length delay circuit of the present invention, it is designed that the output from the delay element being the base of the output is not switched at the switching, at the time when the output is switched. Therefore, the glitch generating at the switching of the output of the delay element is not detected at the output. Consequently, it is not necessary to consider the switching timing of the output from the delay element, and the timing designing at the two step variable length delay circuit becomes easy.

To the inputs to the interpolators, which become the bases of the output, an input signal having a lead phase is always inputted to the input for the lead phase, and an input signal having a lag phase is always inputted to the input for the lag phase. Therefore, the delay time change at switching the input is not generated, and better jitter performance can be realized, and pulse shaped noise (glitches) is prevented.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A method of generating a two step variable length delay, said method comprising:

passing an input clock signal through a plurality of serially-interconnected delay elements, each said delay element having a delay time interval dtc, thereby generating a corresponding plurality of delayed signals;

switchably selecting a set of m (where m is an integer greater than 2) of said plurality of delayed signals, said selected m delayed signals being a first to an mth coarse adjustment delay signals, an nth coarse adjustment delay signal leading an (n+1)th coarse adjustment delay signal in phase by a time interval dtc (n is an integer being 1 or more and (m−1) or less);

generating 2m fine adjustment delay signals from said first to mth coarse adjustment delay signals, a jth fine adjustment delay signal leading a (j+1)th fine adjustment delay signal in a phase by a time interval dtc', said time interval dtc' being finer than said time interval dtc, said generating achieved by:
amplifying said first to mth coarse adjustment delay signals;
for each n, mixing waveforms of said nth and said (n+1)th coarse adjustment delay signals; and
mixing waveforms of said mth and said first coarse adjustment delay signals; and outputting one of said 2m fine adjustment delay signals to be a selected variable length delay output signal.

2. The method of claim 1, wherein said variable length delay output signal is selected by a switch, said method further comprising:

inputting a signal to control which of said 2m fine adjustment delay signals is switched to become said variable length delay output signal, said input control signal being one of a delaying signal and an advancing signal; and based on said input control signal, determining whether any of said first to mth coarse adjustment delay signals currently being used when said input control signal is received is to be switched to another of said plurality of delayed signals, wherein, said coarse adjustment delay signal to be switched comprises a currently-selected coarse adjustment delay signal meeting the following two criteria:
first, a coarse adjustment delay signal for which there is a largest phase difference from a coarse adjustment delay signal or signals being used to generate said fine adjustment delay signal currently selected when said input control signal is received; and
second, a coarse adjustment delay signal for which there is a smaller phase difference between:
a fine adjustment delay signal that a coarse adjustment delay signal, after being switched, is amplified and a fine adjustment delay signal that is to be selected after switching; and
a fine adjustment delay signal that said coarse adjustment delay signal, after being switched, is amplified and said fine adjustment delay signal that is currently selected at the time of switching.

3. The method of claim 2, further comprising determining which of said plurality of delayed signals is to comprise said selected m delayed signals, wherein:

in a case that said currently-selected fine adjustment delay signal is switched to a fine adjustment delay signal whose phase leads by said time interval dtc'a phase of said currently-selected fine adjustment delay signal, a delayed signal from said plurality of delayed signals selected to become one of said m selected delay signals comprises a delayed signal whose phase leads a phase of said coarse adjustment delay signal to be switched by a time interval (m×dtc); and in a case that said currently-selected fine adjustment delay signal is switched to a fine adjustment delay signal whose phase lags a phase of said currently-selected fine adjustment delay signal by said time interval dtc', a delayed signal from said plurality of delayed signals selected to become one of said m selected delay signals comprises a delayed signal whose phase lags a phase of said coarse adjustment delay signal to be switched by the time interval (m×dtc).

4. A two step variable length delay circuit, comprising:

a coarse adjustment delay circuit having three or more delay elements connected in series, each said delay element having a delay time dtc, said coarse adjustment delay circuit outputting a corresponding number of delay element output signals, a first delay element in said coarse adjustment delay circuit receiving an input clock signal;

a first selection switching circuit that selects m of said delay element output signals (m is an integer being 3 or more), said m selected delay element output signals being first to mth signals;

a waveform mixing circuit which receives said first to mth signals as first to mth inputs and provides 2m output signals, said 2m output signals comprising:
  said m delay element output signals, as amplified; and
  m mixed output signals, comprising:
    m−1 mixed signals, each being a signal whose phase is midway between an nth (n is an integer being 1 or more and (m−1) or less) input and an (n+1)th input of said first to mth inputs, said (m−1) mixed output signals being generated by mixing waveforms of said nth input and said (n+1)th input; and
    one mixed output signal whose phase is midway between the first input and the mth input; and a second selection switching circuit that selects one of the 2m outputs from said waveform mixing circuit to be a selected delay output signal.

5. A two step variable length delay circuit in accordance with claim 4, wherein, for said 2m output signals:

said waveform mixing circuit amplifies:
  said nth input to become a (2n−1)th output; and
  said mth input to become a (2m−1)th output; and
said waveform mixing circuit mixes:
  said nth input and said (n+1)th input to become a 2nth output; and
  said mth input and said first input to become a 2mth output,
such that a phase difference between a jth output (j is an integer being 1 or more and (2m−2) or less) and a (j+1)th output is (dtc/2), and when an output from said delay elements is selected so that an input having a phase leading said first input by said time interval dtc is selected to be inputted to said mth input, the phase difference between the (2m−1)th output and the 2mth output becomes the time interval (dtc/2)].

6. A two step variable length delay circuit in accordance with claim 4, wherein said waveform mixing circuit comprises a ring interpolator RIa, said ring interpolator RIa, comprising:

a plurality of m buffers that respectively amplify each of said first to mth inputs;

a plurality of (m−1) interpolators IPx (x is an integer being 1 or more and (m−1) or less); and an mth interpolator IPm, wherein:
  at each of said (m−1) interpolators IPx, the nth input is inputted to a phase lead input and the (n+1)th input is inputted to a phase lag input,
  each of said (m−1) interpolators IPx amplifies the nth input and the (n+1)th input and connects both these amplified inputs to generate an output whose phase is midway between the phases of the nth and the (n+1)th inputs by mixing waveforms of both the inputs, and
  said mth interpolator Ipm, in which the mth input is inputted to a phase lead input and the first input is inputted to a phase lag input, amplifies the mth input and the first input and connects both the amplified mth and first inputs to generate an output whose phase is midway between the phases of the mth and the first inputs by mixing waveforms of both the inputs.

7. A two step variable length delay circuit in accordance with claim 6, wherein:

when two signals whose phases are different from each other are inputted to said ring interpolator, and in a case that a phase lead signal is inputted to a buffer B3 and a phase lag signal is inputted to a buffer B4, and said interpolator IPx and said interpolator IPm include a buffer B1 to which said phase lead signal is inputted and a buffer B2 to which said phase lag signal is inputted, resistance values of transistors of said buffers B1 and B2 are set so that the phase of the signal at the output node to which the outputs from said buffers B1 and B2 are connected becomes a phase midway between the phase of the output from said buffer B3 and the phase of the output from said buffer B4.

8. A two step variable length delay circuit in accordance with claim 7, wherein:

each said buffer B1, B2, B3, and B4 comprises one of an amplifier and an inverter.

9. A two step variable length delay circuit in accordance with claim 4, wherein each said delay element comprises a digital circuit that has delay time of said time interval dtc.

10. A two step variable length delay circuit in accordance with claim 4, further comprising:

first controller that sends a first selection signal to said first selection switching circuit to select said m delay element output signals; and second controller that sends a second selection signal to said second selection switching circuit to select said output signal from said outputs of said waveform circuit.

11. A two step variable length delay circuit in accordance with claim 10, wherein:

when said first controller receives a first delaying signal that makes the output from said waveform mixing circuit currently selected by said second selection switching circuit switch to an output having more phase lead, said first controller causes to be unselected one of said m selected delay element output signals not currently being used to generate said selected delay output signal, and said first controller causes said first selection switching circuit to switch to an output from a delay element whose phase is leading by the time interval (m×dtc), and controls said first selection switching circuit to select m sequential outputs from said delay elements.

12. A two step variable length delay circuit in accordance with claim 11, wherein:
said one of said m selected delay element output signals to be unseleced when said first delaying signal is received comprises the one meeting the following two criteria:
first, a one for which there is a largest phase difference from that of a selected delay element output signal currently being used to generate the output currently selected at the time of switching by said second selection means, and
second, a one for which there is a smaller phase difference between: an output from said waveform mixing circuit that a delay element output signal, after having been switched, is amplified and an output from said waveform mixing selected after said switching; and
an output from said waveform mixing circuit that the delay element output signal to be switched is amplified and the output from said waveform mixing circuit that is currently selected at the time of switching.

13. A two step variable length delay circuit in accordance with claim 11, wherein:
in a case that a pth output (p is an integer being 2 or more and 2m or less) from said waveform mixing circuit is currently selected by said second selection switching circuit, and said second controller receives said first delaying signal,
said second controller controls said second selection switching circuit to switch said pth output from said waveform mixing circuit to the (p−1)th output from said waveform mixing circuit, and
in a case that the first output from said waveform mixing circuit is currently selected by the second selection switching circuit, and said second controller receives said first delaying signal,
said second controller controls said second selection switching circuit to switch said first output from said waveform mixing circuit to the 2mth output from said waveform mixing circuit.

14. A two step variable length delay circuit in accordance with claim 10, wherein:
when said first controller receives a first advancing signal that causes the output from said waveform mixing circuit currently selected by said second selection switching circuit to switch to an output having more phase lag,
said first causes to be switched a delay element output signal not currently being used at that time to generate said selected output signal, and
said first controller causes said first selection switching circuit to switch to an output from said delay element circuit whose phase lags by the time interval (m×dtc), and controls said first selection switching circuit to select m sequential delay element output signals.

15. A two step variable length delay circuit in accordance with claim 14, wherein:
said delay element output signal to be switched when said first advancing signal is received comprises a one of said m selected delay element output signals which meet the following two criteria:
first, a one for which there is a largest phase difference from delay element output signals being used at the time to generate said currently selected output delay signal at the time of switching, and
second, a one for which there is a smaller phase difference between:
an output from said waveform mixing circuit that a delay element output signal, after having been switched, is amplified and an output from said waveform mixing circuit that is to be selected after said switching; and
an output from said waveform mixing circuit that the delay element output signal to be switched is amplified and the output from said waveform mixing circuit that is currently selected at the time of switching.

16. A two step variable length delay circuit in accordance with claim 14, wherein:
when a qth output (q is an integer being 1 or more and (2m−1) or less) from said waveform mixing circuit is currently selected by said second selection switching circuit, and said second controller receives said first advancing signal,
said second controller controls said second selection switching circuit to switch said qth output from said waveform mixing circuit to the (q+1)th output from said waveform mixing circuit, and
when the 2mth output from said waveform mixing circuit is currently selected by the second selection switching circuit, and said second controller receives said first advancing signal,
said second controller controls said second switching circuit to switch said 2mth output from said waveform mixing circuit to the first output from said waveform mixing circuit.

17. A two step variable length delay circuit in accordance with claim 4, further comprising:
r waveform mixing circuits (r is an integer being 1 or more) which are connected in series and disposed between said waveform mixing circuit and said second selection switching circuit.

18. A two step variable length delay circuit in accordance with claim 17, wherein:
when an output side of said waveform mixing, to which a first of said r waveform mixing circuits is connected, is defined as being a previous stage, and an input side of said second selection switching circuit is defined as being a next stage,
at the sth (s is an integer being 1 or more and r or less) waveform mixing circuit in said r waveform mixing circuits, by counting from said previous stage,
when said m delay element signals selected by said first selection switching circuit are inputted to a first to an mth inputs of said waveform mixing circuit in phase lead order,
a first to an (m×2$^s$) outputs from a previous waveform mixing circuit are inputted to a first to an (m×2$^s$) inputs of said sth waveform mixing circuit, respectively,
outputs, which said first to an (m×2$^{s+1}$−1) outputs are amplified, become a first to an (m×2$^s$) inputs, and the output, which waveforms of a tth input (t is an integer being 1 or more and (m×2$^s$−1) or less) and a (t+1)th input are mixed, become a 2tth output, and an output, which waveforms of the (m×2$^s$)th input and the first input are mixed, becomes a (m×2$^{s+1}$) output,
when a time interval between an nth input (n is an integer being 1 or more and (m−1) or less) and an (n+1)th input is (dtc), said n and (n+1) inputs being the outputs from them delay elements selected by said first selection means, the phase difference between the tth input and the (t+1)th input is the time interval (dtc/$2^S$) in the range that the t is 1 to ($2^S \times (m-1)+1$), and the phase difference between a uth output and a (u+1)th output is the time interval (dtc/$2^{S+1}$) in the range that u is 1 to ($2^{S+1} \times (m-1)+1$), and when a phase of said mth input being the output from the mth delay element selected by said first selection switching circuit becomes more lead than the phase of the first input, the phase difference between the tth input and the (t+1)th input is the time interval (dtc/$2^S$) in the range that t is ($2^S \times (m-1)+1$) to (m×$2^S$), and the phase difference between the uth output and the (u+1)th output is the time interval (dtc/$2^{S+1}$) in the range that u is ($2^{S+1} \times (m-1)+1$) to (m×$2^{S+1}$).

19. A two step variable length delay circuit in accordance with claim 18, wherein: said sth waveform mixing circuit in said r waveform mixing circuit comprises a ring interpolator, comprising:

(m×$2^S$) buffers that respectively amplify each of said first to the (m×$2^S$)th inputs;

(m×$2^S$−1) interpolators ipy (y is an integer being 1 or more and (m×$2^S$−1) or less); and interpolator ip (m×$2^S$) wherein:
at each said (m×$2^S$−1) interpolator ipy, the tth input is inputted to a phase lead input and the (t+1)th input is inputted to a phase lag input, and each said (m×$2^S$−1) interpolator ipy amplifies the tth input and the (t+1)th input and connects both the amplified outputs to generate an output whose phase is midway between the phases of the tth and the (t+1)th inputs by mixing waveforms of both the outputs, and at said interpolator ip (m×$2^S$), in which the (m×$2^S$)th input is inputted to a phase lead input and the first input is inputted to a phase lag input, and said interpolator ip (m×$2^S$) amplifies the (m×$2^S$)th input and the first input and connects both the amplified outputs to generate an output whose phase is midway between the phases of the (m×$2^S$)th and the first inputs by mixing waveforms of both the outputs.

20. A two step variable length delay circuit in accordance with claim 19, wherein:

when two signals whose phases are different from each other are inputted to said ring interpolator, and in a case that a phase lead signal is inputted to a buffer B3 and a phase lag signal is inputted to a buffer B4, and said interpolator ipy and said interpolator ip (m×$2^S$) provide a buffer B1 to which said phase lead signal is inputted and a buffer B2 to which said phase lag signal is inputted, resistance values of transistors of said buffers B1 and B2 are set so that the phase of an output node to which the outputs from said buffers B1 and B2 are connected, and at which node their waveforms are mixed, becomes a phase midway between a phase of the output from said buffer B3 and a phase of the output from said buffer B4.

21. A two step variable length delay circuit in accordance with claim 20, wherein:

each said buffer B1, B2, B3, and B4 comprises one of an amplifier and an inverter.

22. A two step variable length delay circuit in accordance with claim 17, wherein:

said second selection switching circuit selects one of the outputs from the last waveform mixing circuit in said r waveform mixing circuit connecting to said second selection switching circuit, said r waveform mixing circuits being connected in series and disposed between said waveform mixing circuit and said second selection switching circuit.

23. A two step variable length delay circuit in accordance with claim 22, wherein:

when said first controller receives a second delaying signal that makes the output from said last waveform mixing circuit being selected by said second selection switching circuit to switch to an output that would have more leading phase than that of said last waveform mixing circuit, said first controller causes to be switched a delay element output signal that is not being used at the time when said second delaying signal is received to generate said selected delay output signal, and said first controller makes said first selection switching circuit switch to delay element output signal whose phase leads by a time interval (m×dtc), and controls said first selection switching circuit to select m sequential delay element output signals.

24. A two step variable length delay circuit in accordance with claim 23, wherein:

said delay element output signal to be switched when said second delaying signal is received comprises one which satisfies the following two criteria:

first, a delay element output signal whose phase difference is the largest from the delay element output signals being used at the time to generate an output from said last waveform mixing circuit which is currently selected at the time of switching by said second selection means; and second, a one for which there is a smaller phase difference between:
an output from said last waveform mixing circuit that a switched delay element output signal is amplified and an output from said last waveform mixing circuit to be selected after said switching; and
an output from said last waveform mixing circuit that the delay element output signal to be switched is amplified and the output from said last waveform mixing circuit that is currently selected at the time of switching.

25. A two step variable length delay circuit in accordance with claim 23, wherein:

in case that an fth output (f is an integer being 2 or more and (m×$2^{S+1}$) or less) from said last waveform mixing circuit is being selected by said second selection switching circuit, and said second controller received said second delaying signal, said second controller controls said second selection switching circuit to switch said fth output from said last waveform mixing circuit to the (f−1)th output from said last waveform mixing circuit.

26. A two step variable length delay circuit in accordance with claim 23, wherein:

in case that the first output from said last waveform mixing circuit is being selected by the second selection switching circuit, and said second controller received said second delaying signal, said second controller controls said second selection switching circuit to switch said first output from said last waveform mixing circuit to the (m×$2^{S+1}$)th output from said last waveform mixing circuit.

27. A two step variable length delay circuit in accordance with claim 22, wherein:

when said first controller receives a second advancing signal that makes the output from said last waveform mixing circuit being selected by said second selection switching circuit switch to an output having more phase lag of said last waveform mixing circuit, said first controller makes to be switched a delay element output signal that is not being used at the time to generate said selected output be an output from said delay element to be switched, and said first controller makes said first selection switching circuit switch to an output from said delay element whose phase is lag by the time interval (m×dtc), and controls said first selection switching circuit to select m sequential outputs from said delay elements.

28. A two step variable length delay circuit in accordance with claim 27, wherein said delay element output signal to be switched, when said second advancing signal was received, comprises one which meets the following two criteria:

first, a delay element output signal for which there is a largest phase difference from the delay element output signals being used at the time to generate the output from said last waveform mixing circuit which is being selected at the time of switching by said second selection switching circuit, and second, a delay element output signal for which there is a smaller phase difference between:

an output from said last waveform mixing circuit that a delay element output signal, after having been switched, is amplified and an output from said last waveform mixing circuit that is to be selected after said switching; and an output from said last waveform mixing circuit that the delay element output signal to be switched is amplified and the output from said last waveform mixing circuit that is currently selected at the time of switching.

29. A two step variable length delay circuit in accordance with claim 27, wherein:

in a case that a gth output (g is an integer being 1 or more and $(m \times 2^{S+1}-1)$ or less) from said last waveform mixing circuit is being selected by said second selection switching circuit, and said second controller received said second advancing signal, said second controller controls said second selection switching circuit to switch said gth output from said last waveform mixing circuit to the (g+1)th output from said last waveform mixing circuit.

30. A two step variable length delay circuit in accordance with claim 27, wherein:

in a case that the $(m \times 2^{S+1})$th output from said last waveform mixing means is being selected by the second selection switching circuit, and said second controller received said second advancing signal, said second controller controls said second selection switching circuit to switch said $(m \times 2^{S+1})$th output from said last waveform mixing circuit to the first output from said last waveform mixing circuit.

31. A two step variable length delay circuit, comprising:

a delay circuit comprising a plurality of serially-interconnected delay elements and outputting a corresponding plurality of delay signals, each said delay element having a delay time dtc, a first of said serially-interconnected delay elements receiving an input clock signal;

a first switching circuit having m switching elements, each of said m switching elements outputting a selected one of said plurality of delay signals;

a waveform mixer comprising m interpolators, said waveform mixer receiving an output signal from each of said m switching elements, said waveform mixer providing 2m output signals, said 2m output signals being said output signals from said m switching elements plus m pair-wise mixed signals of said output signals from said m switching elements; and a second switching circuit receiving said 2m output signals from said waveform mixer and outputting a selected one of said 2m output signals.

32. The two step variable length delay circuit according to claim 31, wherein said waveform mixer comprises a first waveform mixer, said two step variable length delay circuit further comprising:

a second waveform mixer comprising 2m interpolators, said second waveform mixer receiving said 2m output signals from said first waveform mixer, said second waveform mixer providing 4m output signals, said 4m output signals being:

said 2m output signals from said first waveform mixer, as amplified; and 2m pair-wise mixed signals of said 2m output signals from said first waveform mixer, wherein said second switching circuit receives said 4m output signals from said second waveform mixer and outputs a selected one of said 4m output signals.

* * * * *